US012755925B2

(12) United States Patent
Gonen

(10) Patent No.: US 12,755,925 B2
(45) Date of Patent: Oct. 6, 2026

(54) SYSTEM AND METHOD FOR FULLY INTEGRATED MICROCRYSTAL ELECTRON DIFFRACTION (MicroED)

(71) Applicant: The Regents of the University of California, Oakland, CA (US)

(72) Inventor: Tamir Gonen, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 354 days.

(21) Appl. No.: 18/554,185

(22) PCT Filed: Apr. 14, 2022

(86) PCT No.: PCT/US2022/024832
§ 371 (c)(1),
(2) Date: Oct. 5, 2023

(87) PCT Pub. No.: WO2022/231862
PCT Pub. Date: Nov. 3, 2022

(65) Prior Publication Data

US 2024/0387141 A1 Nov. 21, 2024

Related U.S. Application Data

(60) Provisional application No. 63/180,529, filed on Apr. 27, 2021.

(51) Int. Cl.
*H01J 37/22* (2006.01)
*H01J 37/10* (2006.01)
(Continued)

(52) U.S. Cl.
CPC ............ *H01J 37/222* (2013.01); *H01J 37/10* (2013.01); *H01J 37/20* (2013.01); *H01J 37/295* (2013.01); *H01J 2237/20214* (2013.01)

(58) Field of Classification Search
CPC .......... H01J 37/222; H01J 37/10; H01J 37/20; H01J 37/295; H01J 2237/20214
See application file for complete search history.

(56) References Cited

U.S. PATENT DOCUMENTS 5,864,138 A 1/1999 Miyata et al.
2007/0114410 A1* 5/2007 Nishiumi ......... G01N 23/20058 250/311

(Continued)

FOREIGN PATENT DOCUMENTS

WO WO-2020160671 A1 * 8/2020 ....... G01N 23/20058

OTHER PUBLICATIONS

Rodriguez et al., "High-Resolution Macromolecular Structure Determination by MicroED, a cryo-EM Method", Methods in Enzymology, vol. 579, pp. 369-392 (Year: 2016).*

(Continued)

*Primary Examiner* — Georgia Y Epps
*Assistant Examiner* — Hanway Chang
(74) *Attorney, Agent, or Firm* — Quarles & Brady LLP

(57) ABSTRACT

An integrated microcrystal electron diffraction system and method are provided that include an electron source, a sample assembly configured to retain a sample, a camera assembly, and a control system. The control system pre-screens the sample on the sample assembly, collects image data of the sample via the camera assembly, and outputs microcrystal electron diffraction data based on the image data. Pre-screening includes capturing at least one pre-screen diffraction image of the sample; determining a position for the sample for imaging based on the at least one pre-screen diffraction image; and controlling the sample assembly to position the sample at the position. Collecting the image data includes generating an electron beam towards the sample at the position; rotating the sample assembly; and (Continued)

capturing, by the camera assembly, scatterings of the electron beam by the sample as diffraction images while the sample assembly is rotated.

20 Claims, 14 Drawing Sheets

(51) Int. Cl.
*H01J 37/20* (2006.01)
*H01J 37/295* (2006.01)

(56) References Cited

U.S. PATENT DOCUMENTS

| | | | |
|---|---|---|---|
| 2020/0135424 A1 | 4/2020 | Durst et al. | |
| 2020/0158665 A1 | 5/2020 | Gonen et al. | |
| 2021/0217578 A1 | 7/2021 | Kasevich et al. | |
| 2022/0128493 A1 | 4/2022 | Miller et al. | |
| 2022/0216034 A1* | 7/2022 | Dobashi | G01N 23/225 |
| 2023/0228695 A1 | 7/2023 | Gonen et al. | |

OTHER PUBLICATIONS

Blackburn, W. et al., Some Techniques of Transmission Lorentz Microscopy, Journal of Scientific Instruments (Journal of Physics E), 1969, Series 2, vol. 2, pp. 570-574.

Bucker, R. et al., Serial Protein Crystallography in an Electron Microscope, Nature Communications, 2020, 11:996, pp. 1-8.

De La Cruz, M. et al., MicroED Data Collection with SerialEM, Ultramicroscopy, 2019, 201:77-80.

Martynowycz, M. et al., Microcrystal Electron Diffraction of Small Molecules, JoVE Journal of Visualized Experiments, 2021, 169:e62313, pp. 1-11.

PCT International Search Report and Written Opinion, PCT/US2022/024832, Jul. 27, 2022, 11 pages.

European Patent Office, Extended Search Report, Application No. 22796385.7, Feb. 6, 2025, 11 pages.

Hattne, J. et al., "MicroEd data collection and processing", Acta Cryst. (2015), A71, 353-360.

LVEM 5, Low Voltage Benchtop Electron Microscope brochure, Delong Instruments, 8 pages, date unknown.

Nannenga, B. et al., "The cryo-EM method microcrystal electron diffraction (MicroED)", Nature Methods, vol. 16, May 2019, 369-379.

"Rigaku and JELO Launch a Revolutionary Electron Diffraction Platform XTALAB Synergy-Ed", Rigaku Global Website, https://www.rigaku.com/press/tue-05252021-1200/192631151, 4 pages, printed Apr. 5, 2022.

"XtaLAB Synergy-ED", Rigaku Global Website, https://rigaku.com/products/crystallography/synergy-ed?utm_term=microed&utm_campaign=Chemical+Crystallography&utm_source=adwords&u . . . , 6 pages, printed Apr. 5, 2022.

* cited by examiner

SYSTEM AND METHOD FOR FULLY INTEGRATED MICROCRYSTAL ELECTRON DIFFRACTION (MicroED)

CROSS-REFERENCE TO RELATED APPLICATIONS

This application represents the national stage entry of PCT/US2022/024832 filed on Apr. 14, 2022 and claims priority to U.S. Provisional Application No. 63/180,529, titled "System and Method for Fully Integrated Microcrystal Electron Diffraction (MICROED)," filed on Apr. 27, 2021, the contents of each of which is hereby incorporated by reference in its entirety.

STATEMENT REGARDING FEDERALLY SPONSORED RESEARCH

This invention was made with government support under GM136508 awarded by the National Institutes of Health. The government has certain rights in the invention.

BACKGROUND

Microcrystal electron diffraction (MicroED) allows the collection of high-resolution electron diffraction data from extremely small (sub-micron-sized) protein microcrystals using an electron cryo-microscope (cryo-EM). To perform MicroED, a standard transmission electron microscopy (TEM) system may be modified to use a continuous rotation-controlling device.

SUMMARY OF THE DISCLOSURE

In some MicroED systems, a standard transmission electron microscopy (TEM) system is used. These general purpose TEM systems are large, expensive, and complicated and tedious to configure for MicroED use.

In at least some embodiments described herein, a custom and automatic MicroED system is provided that has a reduced size and cost relative to TEM systems, and requires less operator time and experience to configure and use. In some embodiments, the MicroED system generates and uses a pre-screening technique to configure the system for a MicroED operation, provides distinct preset magnification configurations applicable to MicroED operations, generates image data including diffraction images captured by a camera assembly and tagged with characteristic data, and generates MicroED output data (e.g., for display on an integrated display screen) including one or more of: 1) the atomic structure of a specimen, 2) the full identity of the specimen without prior knowledge, 3) information about sample components (e.g., if specimen is a mixture), 4) the percent (%) contamination of the specimen and identity of the contaminants, 5) purity information for the specimen, and 6) a three-dimensional graph of diffraction data generated from a combination of the obtained diffraction images/movie frames.

In one embodiment, an integrated microcrystal electron diffraction system is provided. The system includes an electron source, a sample assembly configured to retain a sample, a camera assembly, and a control system including an electronic processor. The control system is configured to: pre-screen the sample on the sample assembly, collect image data of the sample via the camera assembly, and output microcrystal electron diffraction data based on the image data. Pre-screening the sample includes capturing, by the camera assembly, at least one pre-screen diffraction image of the sample; determining, by the control system, a position for the sample for imaging based on the at least one pre-screen diffraction image; and controlling, by the control system, the sample assembly to position the sample at the position. Collecting the image data includes: generating, by the electron source, an electron beam towards the sample at the position; rotating the sample assembly; and capturing, by the camera assembly, scatterings of the electron beam by the sample as diffraction images while the sample assembly is rotated.

In another embodiment, a method for integrated microcrystal electron diffraction is provided. The method includes pre-screening a sample on a sample assembly, collecting image data of the sample, and outputting, by a control system, microcrystal electron diffraction data based on the image data. Pre-screening the sample includes capturing, by a camera assembly, at least one pre-screen diffraction image of the sample; determining, by the control system, a position for the sample for imaging based on the at least one pre-screen diffraction image; and controlling, by the control system, the sample assembly to position the sample at the position. Collecting the image data includes: generating, by the electron source, an electron beam towards the sample at the position; rotating the sample assembly; and capturing, by the camera assembly, scatterings of the electron beam by the sample as diffraction images while the sample assembly is rotated.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention. Like reference numerals will be used to refer to like parts from Figure to Figure in the following description.

DETAILED DESCRIPTION

In some MicroED systems, a standard transmission electron microscopy (TEM) system is used. These general purpose TEM systems are large, expensive, and complicated and tedious to configure for MicroED use.

In at least some embodiments described herein, a custom and automatic MicroED system is provided that has a reduced size and cost relative to TEM systems, and requires less operator time and experience to configure and use. In some embodiments, the MicroED system generates and uses a pre-screening technique to configure the system for a MicroED operation, provides distinct preset magnification configurations applicable to MicroED operations, generates image data including diffraction images captured by a camera assembly and tagged with characteristic data, and generates MicroED output data (e.g., for display on an integrated display screen) including 1) the atomic structure of a specimen, 2) the full identity of the specimen without prior knowledge, 3) information about sample components (e.g., if specimen is a mixture), 4) the percent (%) contamination of the specimen and identity of the contaminants, 5) purity information for the specimen, and 6) a three-dimensional image or graph of diffraction data generated from a combination of the obtained two-dimensional diffraction images.

In some embodiments, an automated MicroED system, such as disclosed herein, provides for enhanced drug-discovery capabilities, accelerating the design and discovery of a broad spectrum of countermeasures and vaccines. For example, in some embodiments, the automated MicroED system is used for identification of small molecules bound to target proteins during drug development. Additionally, the automated MicroED system may provide a substantial amount of structural information (e.g., three-dimensional (3D) structures), in a short amount of time, which can feed artificial intelligence (AI) and machine learning (ML) systems used for discovering drugs, drug-protein complexes, and the like. For example, large datasets of training data may enhance and improve the effectiveness of ML systems, and embodiments of the automated MicroED system enable rapid generation of such datasets of MicroED output data, such as datasets of 3D structures. The ability for rapid generation of datasets can be, in part, based on the ability for reduced amounts of sample materials (e.g., femtogram amounts) to be used to generate atomic-level resolution of structural data, and through an automated process that is performed without the intervention of highly trained individuals configuring the system in delay-inducing intermediate steps.

Figure 1:
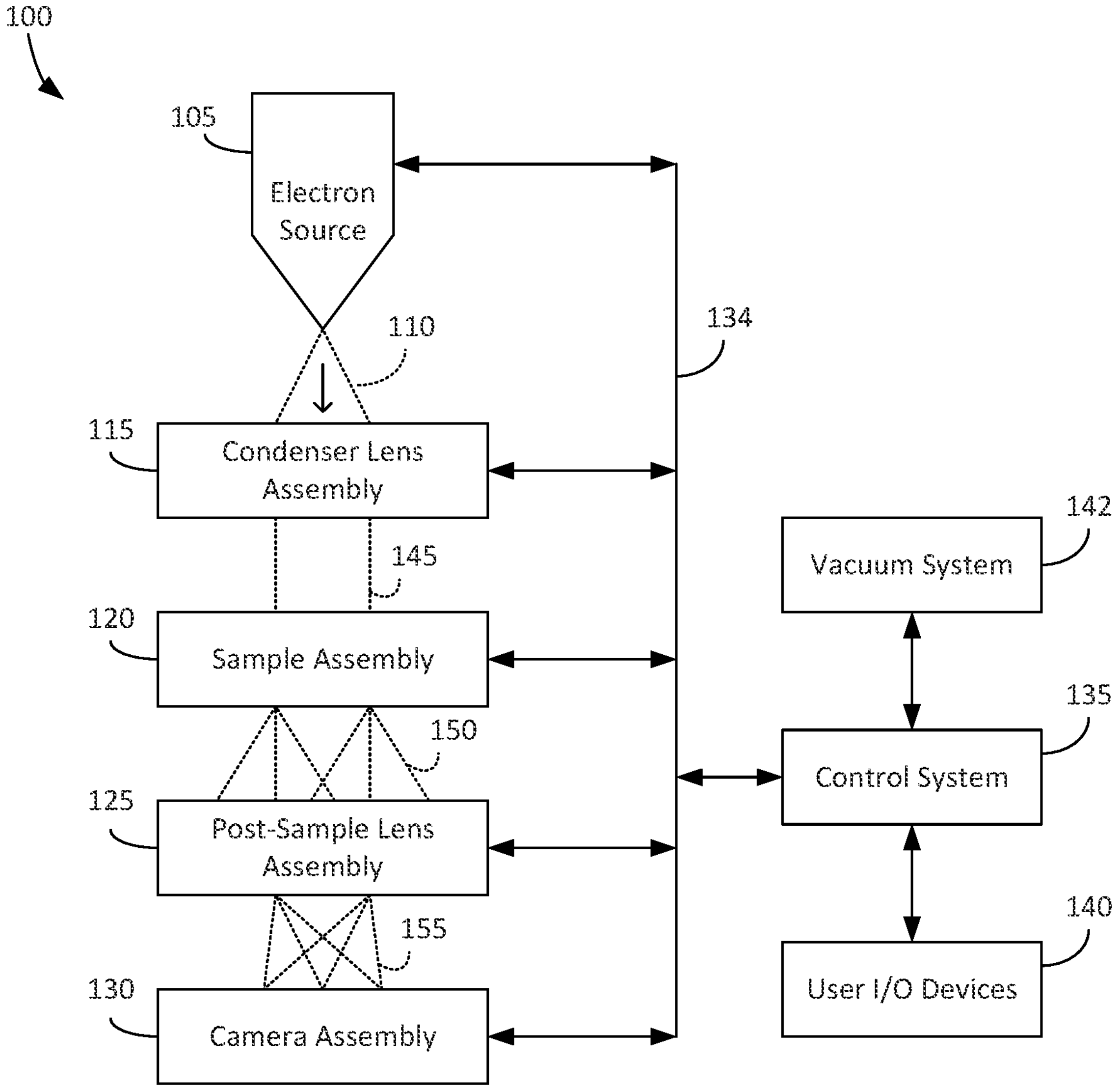
FIG. 1 is a diagram of a microcrystal electron diffraction (MicroED) system in accordance with some embodiments.

FIG. 1 illustrates a microcrystal electron diffraction (MicroED) system 100, according to some embodiments. The MicroED system 100 is a transmission electron microscope (TEM) and includes an electron source 105 that generates an electron beam 110, a condenser lens assembly 115, a sample assembly 120, a post-sample lens assembly 125, a camera assembly 130, and a communication bus 134. The MicroED system 100 further includes a control system 135, one or more user input/output devices 140 coupled to the control system 135, and a vacuum system 142 coupled to the control system 135.

The control system 135 is configured to control the other components of the MicroED system 100 to generate and process image data. More particularly, the control system 135 is coupled to and controls the electron source 105, the condenser lens assembly 115, the sample assembly 120, the post-sample lens assembly 125, the camera assembly 130, the user input/output devices 140, and the vacuum system 142 via the communication bus 134.

Figure 2:
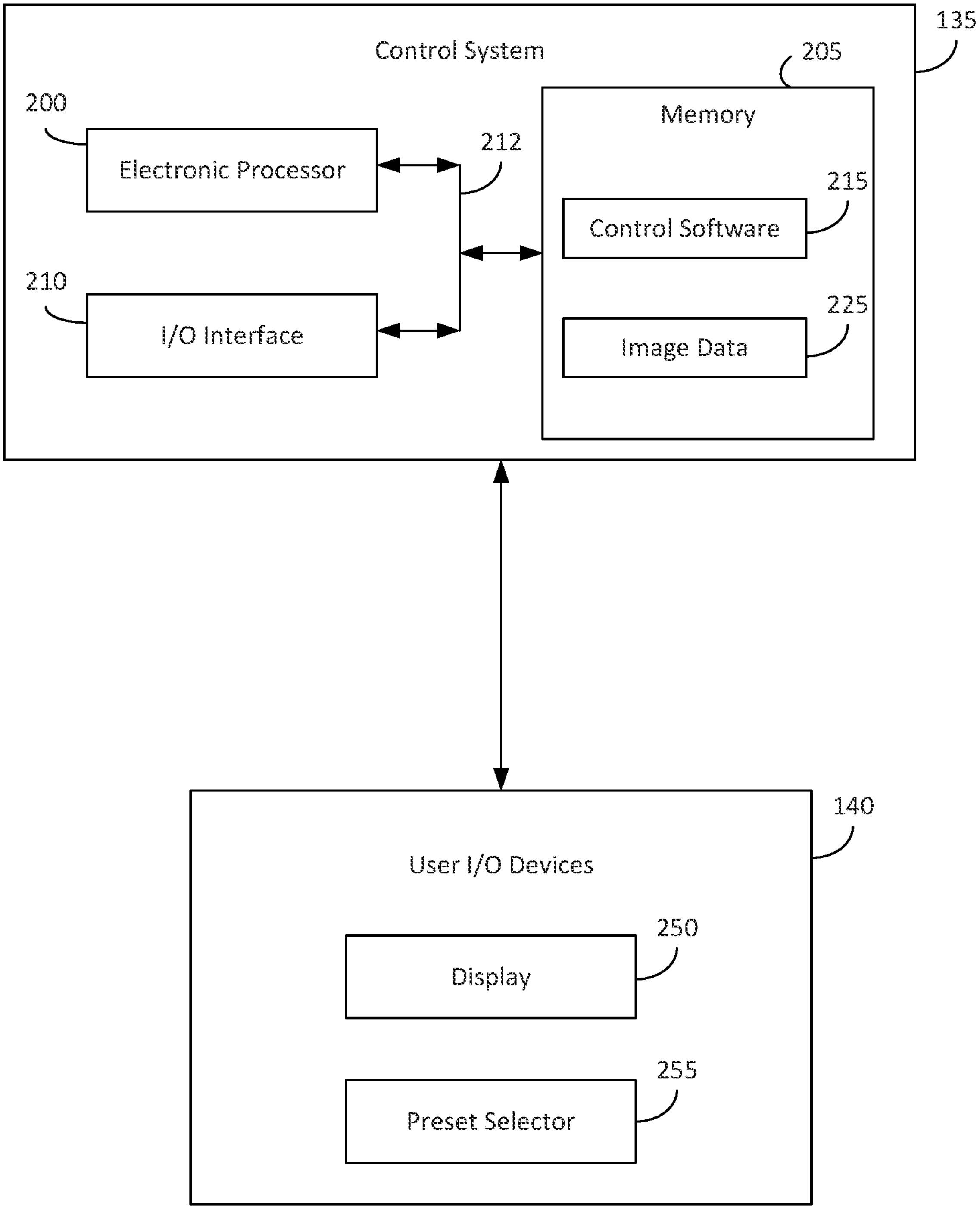
FIG. 2 is a diagram of a control system and user input/output device of the MicroED system of FIG. 1 in accordance with some embodiments.

FIG. 2 illustrates a block diagram of the control system 135 and the user input/output devices 140, according to some embodiments. As illustrated, the control system 135 includes an electronic processor 200, a memory 205, and an input/output interface 210 coupled by a communication bus 212. The memory 205 includes one or more of a read only memory (ROM), random access memory (RAM), or other non-transitory computer-readable media. The electronic processor 200 is configured to, among other things, receive instructions and data from the memory 205 and execute the instructions to, for example, carry out the functionality of the control system 135 described herein, including the processes 1000 of FIG. 10, 1100 of FIG. 11, 1200 of FIG. 12, and 1400 of FIG. 14. For example, the memory 205 includes one or more of control software 215 and image data 225. Generally, the electronic processor 200 may be configured to execute the control software 215 to generate, process, and store the image data 225, and to generate and output MicroED output. In some embodiments, instead of or in addition to executing software from the memory 205 to carry out the functionality of the control system 135 described herein, the electronic processor 200 includes one or more hardware circuit elements configured to perform some or all of this functionality.

The input/output interface 210 includes input and output interface elements that enable the electronic processor 200 to communicate with and control the other components of the MicroED system 100, including the user input/output devices 140. In some embodiments, the input/output interface 210 enables wireless and/or wired communication according to one or more known protocols (e.g., Wi-Fi, Bluetooth, USB, etc.). For example, the input/output interface 210 includes wired or wireless interface circuitry, such as antennas, wired ports, and transceivers for transmitting and receiving signals using antennas and/or wired ports.

Although the control system 135 is illustrated as a single unit, in some embodiments, one or more components of the control system 135 is remote from the other components, is a distributed component, or a combination thereof. For example, in some embodiments, the memory 205 includes local memory co-located with the electronic processor 200 as well as remote memory located off-site and, for example, connected to the electronic processor 200 by one or more networks (e.g., a local area network or another wide area network such as the Internet). Similarly, in some embodiments, the electronic processor 200 includes one or more local microprocessors and, in other embodiments, the electronic processor 200 is a distributed processing system including a combination of one or more local microprocessors and remote processors (e.g., cloud computing).

The user input/output devices 140 include one or more devices enabling a user to interact with the MicroED system 100. As illustrated, the user input/output devices 140 includes a display 250 for displaying one or more images generated by the camera assembly 130 and a preset selector 255 for receiving a selection of a preset magnification configuration for the MicroED system 100. In other embodiments, one or more other user input/output devices 140 are provided in addition to or instead of the elements shown in FIG. 2. For example, the user input/output devices 140 may include one or more of displays, touchscreens, touchscreen displays, keyboards, mice, pushbuttons, dials, pedals, and the like. In some embodiments, the display is a touch screen display 250 that incorporates the preset selector 255 to receive the selection, input of other operational parameters for the MicroED system 100, or a combination thereof.

In general, to analyze a sample, the MicroED system 100 directs an electron beam towards a rotating sample and captures images of a diffracted beam that results from the interaction of the beam with the sample at the different rotational positions of the sample. More specifically, and with reference back to FIG. 1, the control system 135 controls the electron source 105 to generate the electron beam 110. The electron beam 110 is received by the condenser lens assembly 115, which condenses the beam 110 to produce a condensed electron beam 145, also referred to as a condensed beam 145. The condensed beam 145 is transmitted to the sample assembly 120, which includes thereon a sample to be analyzed. The condensed beam 145 interacts with the sample of the sample assembly 120, for example, causing the condensed beam 145 to be absorbed and/or scattered by the sample. The scattered portion of the beam, scattered beam 150, continues to the post-sample lens assembly 125, which focuses the scattered beam 150 on a detector of the camera assembly 130 as a diffraction pattern 155.

The camera assembly 130 captures an image of the diffraction pattern 155, and provides the image to the control system 135 for one or more of storing, processing, displaying, and transmission. The sample is then rotated, and the camera assembly 130 captures a further image of the diffraction pattern 155, which will generally change because of the rotation of the sample. This process repeats such that the sample continues to rotate and the camera assembly 130 continues to capture further images of the diffraction pattern 155 at the different rotational positions of the sample.

When a desired amount of images have been captured or the sample has completed rotating through a desired set of rotational positions, the electronic processor 200 of the control system 135 processes the image data and outputs MicroED output data. Outputting the MicroED output data may include the electronic processor 200, for example, storing the three-dimensional image on the memory 205, displaying the three-dimensional image on the three-dimensional display 250, and/or transmitting the three-dimensional image to another device via the I/O interface 210 (e.g., for further storage, display, or dissemination).

The control system 135 is further configured to control the vacuum system 142 to create a vacuum in which components of the MicroED system 100 operate, including one or more of the electron source 105, the condenser lens assembly 115, the sample assembly 120, the post-sample lens assembly 125, and the camera assembly 130. For example, the vacuum system 142 may include a turbo pump controlled by the control system 135 to selectively create a vacuum in a sealed portion of the MicroED system 100, for example, after insertion of a sample for analysis into the MicroED system 100.

As described in further detail below, the MicroED system 100 may be configured in particular ways to reduce the size and cost of a system that performs MicroED operations, improve the quality of images, improve the ease of use by an operator, improve throughput of sample analysis, among other advantages.

Figure 3A:
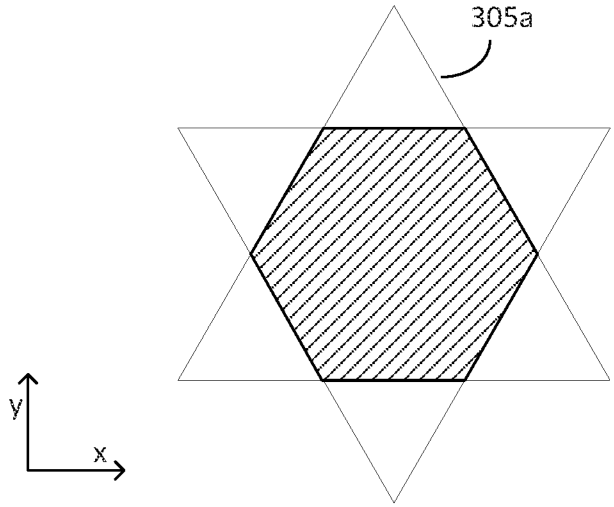
FIGS. 3A and 3B illustrate examples of field emission electron source tips for use in the MicroED system of FIG. 1 in accordance with some embodiments.
Figure 3B:
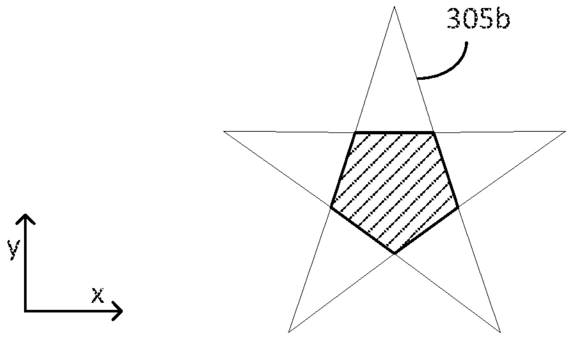

For example, the electron source 105 may be of a type and configuration particularly suited for MicroED. For example, the electron source 105 may have the general properties of having large spatial coherence, having small temporal coherence, and outputting a beam that is parallel with minimal divergence. In some embodiments, the electron source 105 includes a cathode with a Lanthanum Hexaboride ($LaB_6$) filament. In other embodiments, the electron source 105 is a field emission gun. In either case, the electron source 105 may have a power range of between 5-300 kilo-electronvolts (kV), or another range that is a subset of this range (e.g., a range having a maximum value selected from any number up to 300 kV, and a minimum value selected any number down to 5 kV). Further, in some embodiments, a tip of the electron source 105 has a star shape, such as tip 305*a* having a six-pointed star shape shown in FIG. 3A or tip 305*b* having a five-pointed star shape shown in FIG. 3B. The star-shapes are designed to increase spatial coherence. The electron beam 110 is emitted from the tip of the electron source 105. Thus, the views of the tips 305*a* and 305*b* are from the perspective of the condenser lens assembly 115 looking upward to the electron source 105.

In some embodiments, the flux on the sample assembly 120 from the electron source 105 is between 0.0001 electrons per square angstrom ($e-/Å^2$) and 100 $e-/Å^2$ (or another range that is a subset of this range). In some embodiments, the electron source 105 has an energy spread that is less than 1 $e^-V$. In some embodiments, the electron source 105 has a beam size with a diameter between 1 nanometer (nm) and 50 micrometers (μm) (e.g., measured at the sample), or between another range that is a subset of this range.

Figure 4:
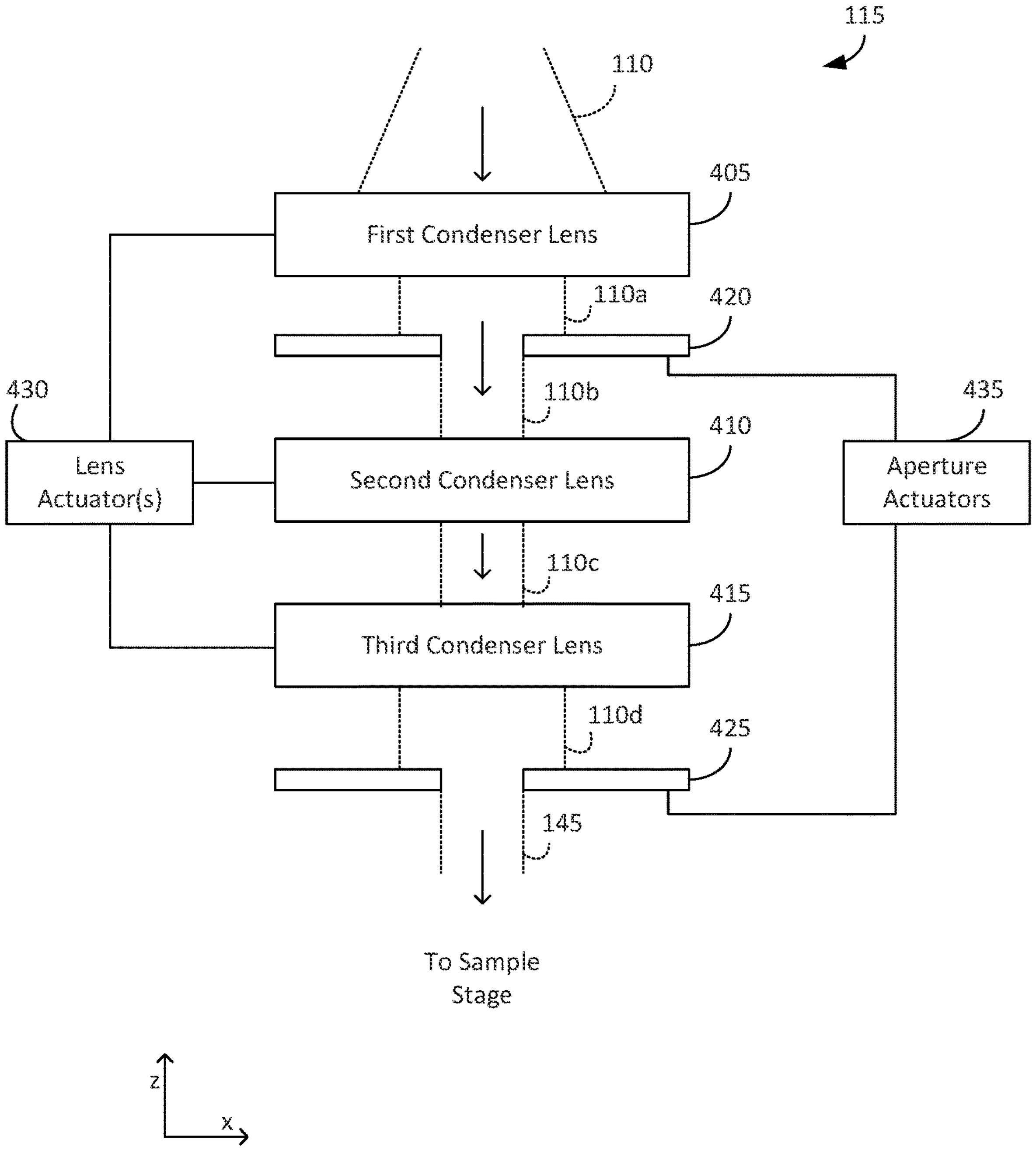
FIG. 4 illustrates a condenser lens assembly of the MicroED system of FIG. 1 in accordance with some embodiments.

FIG. 4 illustrates the condenser lens assembly 115 in further detail, according to some embodiments. As noted, the condenser lens assembly 115 receives the electron beam 110 and condenses the beam 110 to produce the condensed beam 145. As shown in FIG. 4, the condenser lens assembly 115 includes three lenses: a first condenser lens 405, a second condenser lens 410, and a third condenser lens 415. The first condenser lens 405 receives the electron beam 110 and outputs the beam (beam 110*a*) towards a first condenser aperture 420. The first condenser aperture 420 allows or permits a portion of the beam 110*a* to pass through as the beam 110*b*, which is received by the second condenser lens 410. The second condenser lens outputs the beam 110*b* as beam 110*c*, which is received by the third condenser lens 415. The third condenser lens 415 outputs the beam 110*c* as beam 110*d* towards a second condenser aperture 425. The second condenser aperture 425 allows or permits a portion of the beam 110*d* to pass through as the condensed beam 145. In some embodiments, additional or fewer apertures and lenses are included in the condenser lens assembly 115.

The condensed beam 145 generated by the condenser lens assembly 115 is a collimated beam that provides parallel illumination with a spot size having a diameter between 1 nanometer (nm) and 50 micrometers (μm) (or between another range that is a subset of this range) and with a spread of between 0.0001 $e-/Å^2$ to 100 $e-/Å^2$ (or another range that is a subset of this range).

The condenser lens assembly 115 further includes one or more lens actuators 430 and one or more aperture actuators 435. In some embodiments, each of the lens actuators 430 includes a current driver circuit, and each of the aperture actuators 435 includes a piezo motor. The lens actuators 430 are coupled to and controlled by the control system 135 (e.g., by signals from the electronic processor 200) to change the current supplied to one or more of the lenses 405, 410, and 415 and, thereby, adjust the focus and/or magnification of the condenser lens assembly 115. Additionally, the aperture actuators 435 are coupled to and controlled by the control system 135 (e.g., by signals from the electronic processor 200) to open and close the apertures 420 and 425. The control system 135 can further control the amount that each aperture 420 and 425 opens and the duration that each aperture 420 and 425 is opened. FIGS. 8A-8D, described below, provide further details on examples of the apertures 420 and 425.

Figure 5:
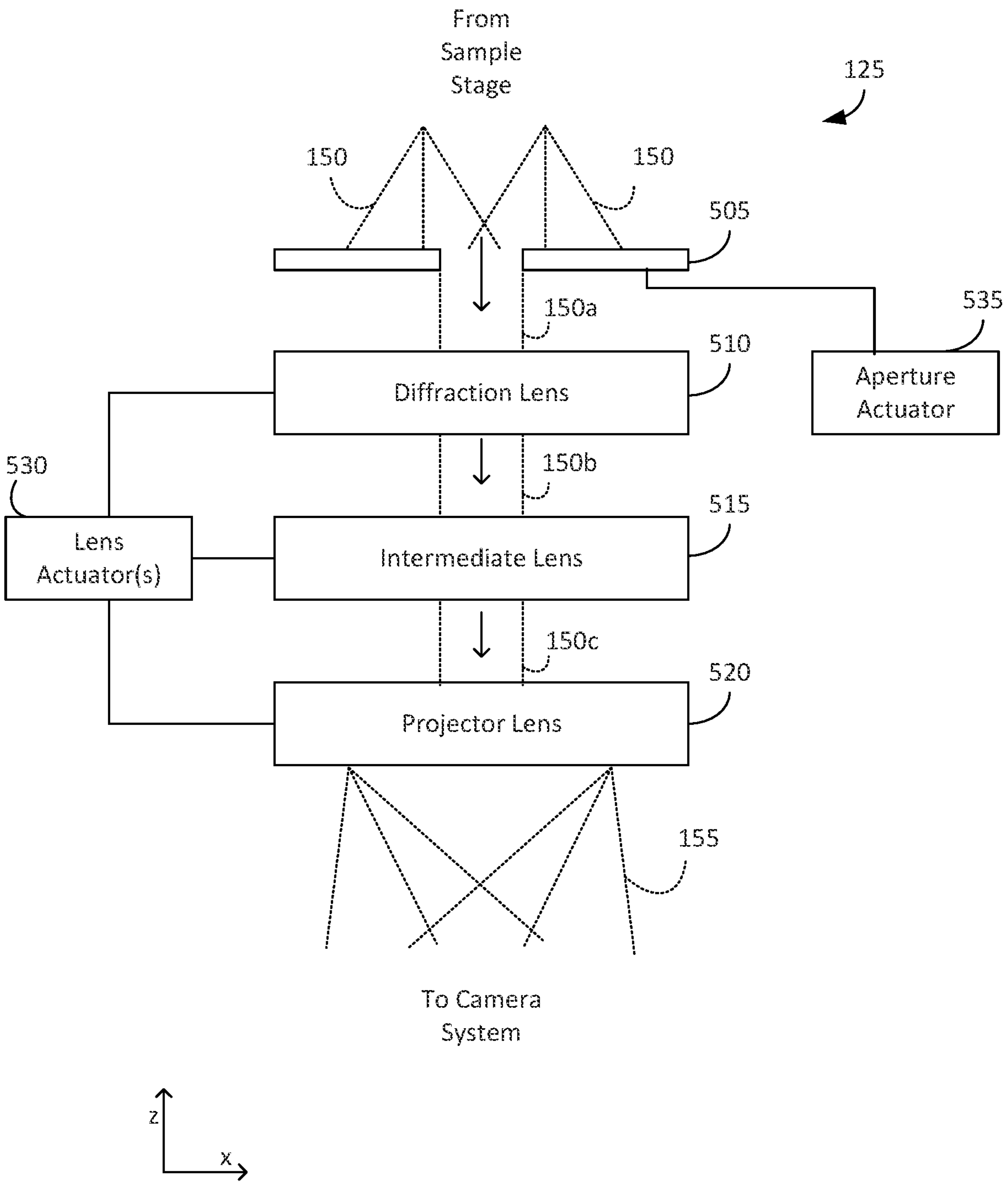
FIG. 5 illustrates a post-sample lens assembly of the MicroED system of FIG. 1 in accordance with some embodiments.

FIG. 5 illustrates the post-sample lens assembly 125 in further detail, according to some embodiments. As noted with respect to FIG. 1, the post-sample lens assembly 125 receives the scattered beam 150 from the sample assembly 120 and focuses the scattered beam 150 on a detector of the camera assembly 130 as a diffraction pattern 155. As shown in FIG. 5, the post-sample lens assembly 125 includes an aperture 505 and three lenses: a diffraction lens 510, an intermediate lens 515, and a projector lens 520. In some embodiments, additional or fewer apertures and lenses are included in the post-sample lens assembly 125.

The aperture 505 receives the scattered beam 150 and allows a portion of the scattered beam 150 to pass through to the diffraction lens 510 as a scattered beam 150*a*. The diffraction lens 510 outputs the scattered beam 150*a* as scattered beam 150*b* to the intermediate lens 515. The intermediate lens 515 outputs the scattered beam 150*b* as a scattered beam 150*c* to the projector lens 520. The projector lens 520 outputs the scattered beam 150*c* as the diffraction pattern 155.

The post-sample lens assembly 125 further includes one or more lens actuators 530 and one or more aperture actuators 535. In some embodiments, each of the lens actuators 530 includes a current driver circuit, and each of the aperture actuators 535 includes a piezo motor. The lens actuators 530 are coupled to and controlled by the control system 135 (e.g., by signals from the electronic processor 200) to change the current supplied to one or more of the lenses 510, 515, and 520 to thereby adjust the focus and/or magnification of the post-sample lens assembly 125. Additionally, the aperture actuators 535 are coupled to and controlled by the control system 135 (e.g., by signals from the electronic processor 200) to open and close the aperture 505. The control system 135 can further control the amount that the aperture 505 opens and the duration that the aperture 505 is opened. FIGS. 8A-8D, described below, provide further details on examples of the aperture 505.

In some embodiments, the condenser lens assembly 115 and post-sample lens assembly 125 have one or more preset configurations. For example, in some embodiments, the condenser lens assembly 115 and post-sample lens assembly 125 have a plurality of preset magnification configurations that specify a particular magnification (diffraction length) for the MicroED system 100. Example preset magnification configurations are provided in the below Table I. In some embodiments, additional, fewer, or different preset magnification configurations are provided.

TABLE I

Example Preset Magnification Configurations

| Magnification (Diffraction Length in Millimeters (mm)) | Resulting Resolution Limit at Camera Edge |
|---|---|
| 200 mm | 0.5 Å |
| 500 mm | 0.8 Å |
| 800 mm | 1.0 Å |
| 1200 mm | 1.2 Å |

In some embodiments, to switch between preset magnification configurations, the control system 135 receives a preset selection input signal from the preset selector 255. For example, the preset selector 255 may be a pushbutton, dial, soft key on a touchscreen display, or the like, that receives or senses a user input indicative of a desired preset and, in response, outputs an indication of the desired preset as the preset selection input signal to the control system 135. For example, with reference to the four preset magnification configurations shown in Table I, the preset selector 255 may be a four-position dial that provides a signal indicating its current position among the four potential positions, with each position corresponding to one of the four preset magnification configurations. In response to receiving the preset selection input signal from the preset selector 255, the control system 135 determines the desired preset magnification configuration indicated by the signal and controls one or both of the condenser lens assembly 115 and the post-sample lens assembly 125 to enter the desired preset magnification configuration.

In some embodiments, to control the one or both of the condenser lens assembly 115 and the post-sample lens assembly 125 to enter the desired preset magnification configuration, the control system 135 provides control signals to one or more of the lens actuator(s) 430 and 530 to adjust the current supplied to one or more of the lenses of the lens assembly 115 and/or the lens assembly 125 to a predetermined level to achieve the desired magnification.

Figure 6:
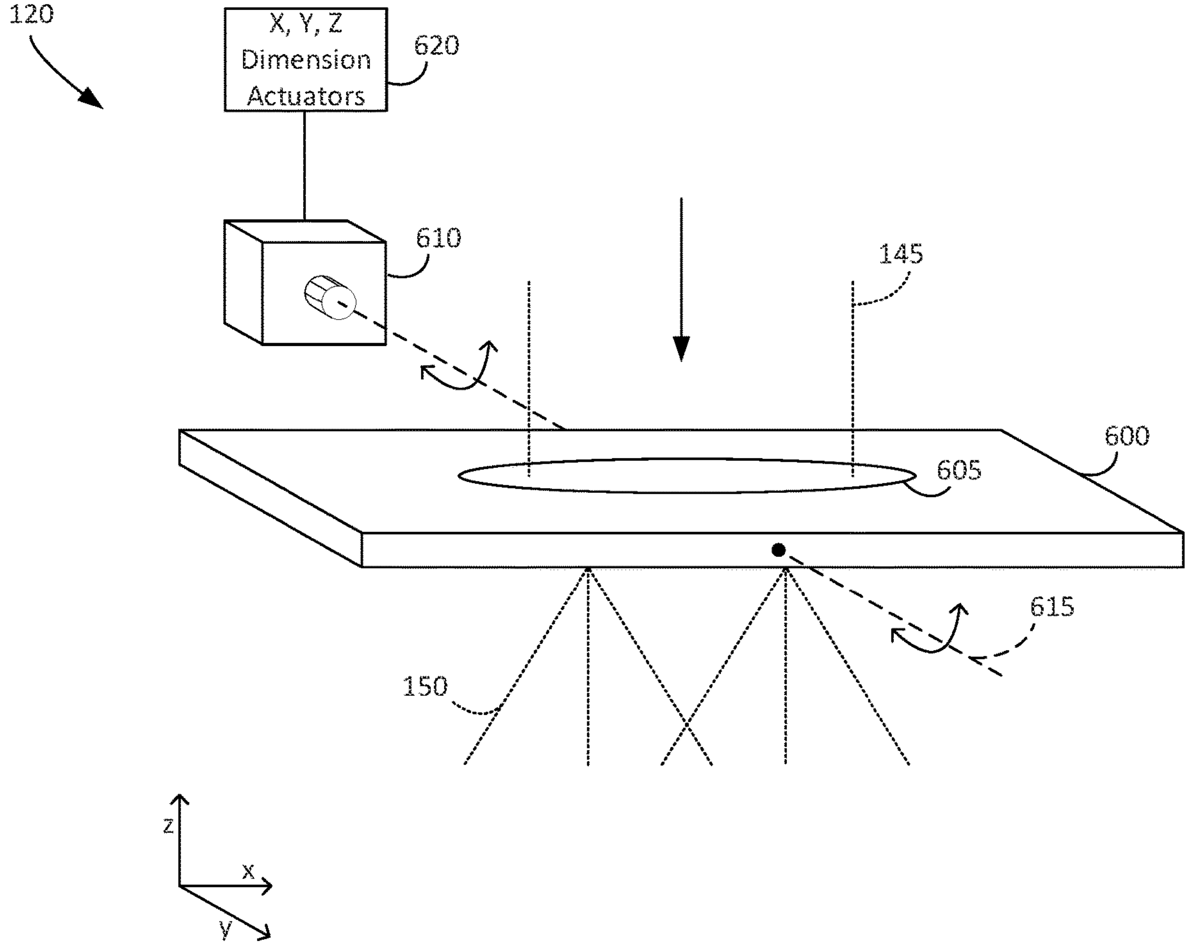
FIG. 6 illustrates a sample assembly of the MicroED system of FIG. 1 in accordance with some embodiments.

FIG. 6 illustrates the sample assembly 120, which includes a sample stage 600 on which a specimen 605 is positioned for analysis by the MicroED system 100. An actuator 610, such as a piezo motor, rotates the sample stage 600 about an axis 615. The control system 135 (e.g., the electronic processor 200) provides control signals to the actuator 610 to drive the actuator 610 to rotate the sample stage 600. In some embodiments, the rotational position of the sample stage 600 about the axis 615 is calibrated at a default position (e.g., a horizontal, 0 degree position, as shown in FIG. 6) and the control system 135 monitors the position of the sample stage 600 using open loop control. In some embodiments, rather than using open loop control, the control system 135 uses closed loop control and monitors the position of the sample stage 600 using feedback from a positional sensor (e.g., a laser positional sensor) that outputs a signal indicative of the rotational position of the sample stage about the axis 615.

In some embodiments, during the course of a MicroED 100 operation, the control system 135 is configured to rotate the sample stage 600 plus and minus (+/−) 30 degrees about the axis 615 relative to an initial horizontal position such as shown in FIG. 6. In this example, the amount of rotation of the sample stage 600 during a MicroED operation is 60 degrees, which may be referred to as the scan rotation amount. In some embodiments, the control system 135 controls the rotation of the sample stage 600 through other rotational ranges, such as +/−70 degrees (scan rotation of 140 degrees) or a full 360 degree rotation (scan rotation of 360 degrees).

During a MicroED operation, the control system 135 controls the rotation speed of the actuator 610, and, therefore, the sample stage 600. For example, the rate of change may be continuous. Any change in speed may be linear or otherwise predicable or consistent, for example, to facilitate reconstruction. With reference to the axis 615, the speed control may be specified in degrees per second and the rotation angle of the sample stage 600 may be specified in degrees. In some embodiments, the control system 135 may control the rotation speed of the sample stage 600 to be between 0.01 degrees/second and 10 degrees/second. In some embodiments, the rotation by the control system 135 and actuator 610 is further controlled such that the speed is linear (e.g., having an R-squared ($R^2$) statistical measure greater than or equal to 95) and does not jump (nonlinearly change) at any point during the rotation through the full rotation range.

In some embodiments, the control system 135 may adjust one or more of the height of the sample stage 600 in the z-direction, for example, by changing the elevation of the actuator 610 supporting the sample stage 600 using x, y, z-dimension actuator(s) (e.g., one or more piezo motors). In some embodiments, the control system 135 may also adjust the position of the sample stage 600 in the x-direction and the position of the sample stage 600 in the y-direction by controlling the x, y, z-dimension actuator(s) 620 coupled to the actuator 610 to adjust the position of the actuator 610 and the sample stage 600 together (or otherwise coupled to the sample stage 600 to control the position thereof). Sensors, such as rotary encoders coupled to the various actuators or laser distance measurers aimed at the sample stage 600, may provide an indication of the x, y, and z position of the sample stage 600 to the control system 135.

The sample stage 600 is within a vacuum and may include a support film such as an amorphous carbon grid, silicone, or nitrate, or other support material, or a carbon grid with holes to support the specimen 605. The specimen 605 may be, for example, a powder, one or more crystals, or one or more crystals suspended in a sampling gel or liquid (e.g., in a capillary formed between two carbon grids having windows to allow the electron beam to pass through). capillary with sampling gel or liquid.

Figure 11:
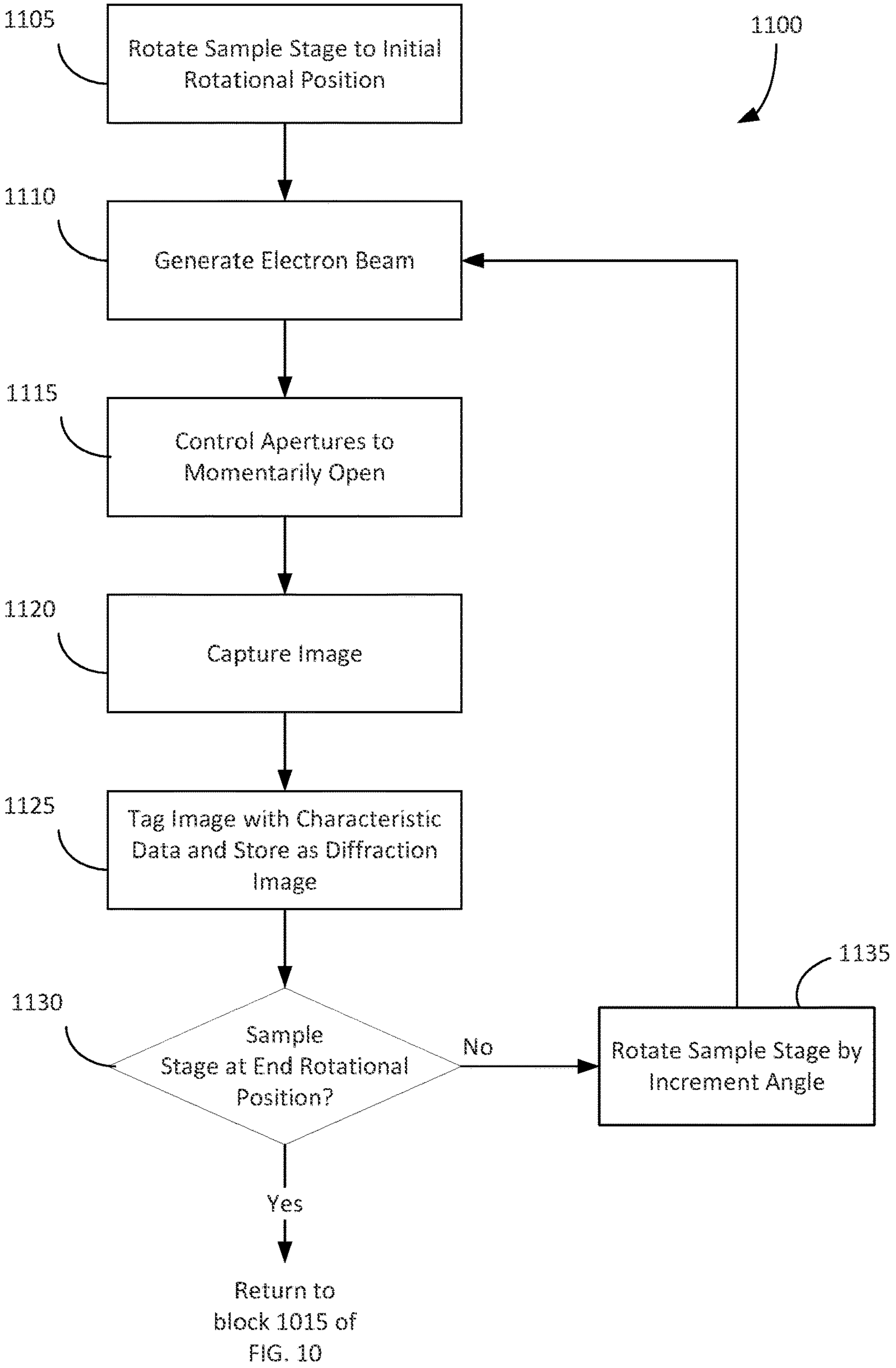
FIG. 11 illustrates a process for collecting image data using the MicroED system of FIG. 1 in accordance with some embodiments.

In some embodiments, during the course of a rotation of the sample stage 600 in a MicroED operation, the control system 135 repeatedly determines the rotation speed of the sample stage 600; rotational position of the sample stage 600; x, y, and z position of the sample stage 600; electron dose (e.g., in electrons per square angstrom (e−/Å$^2$) per second); and current time (i.e., a time stamp) for each image and stores one or more of these characteristics along with each captured image by the camera assembly 130, as is discussed further with respect to block 1125 of FIG. 11.

Figure 7A:
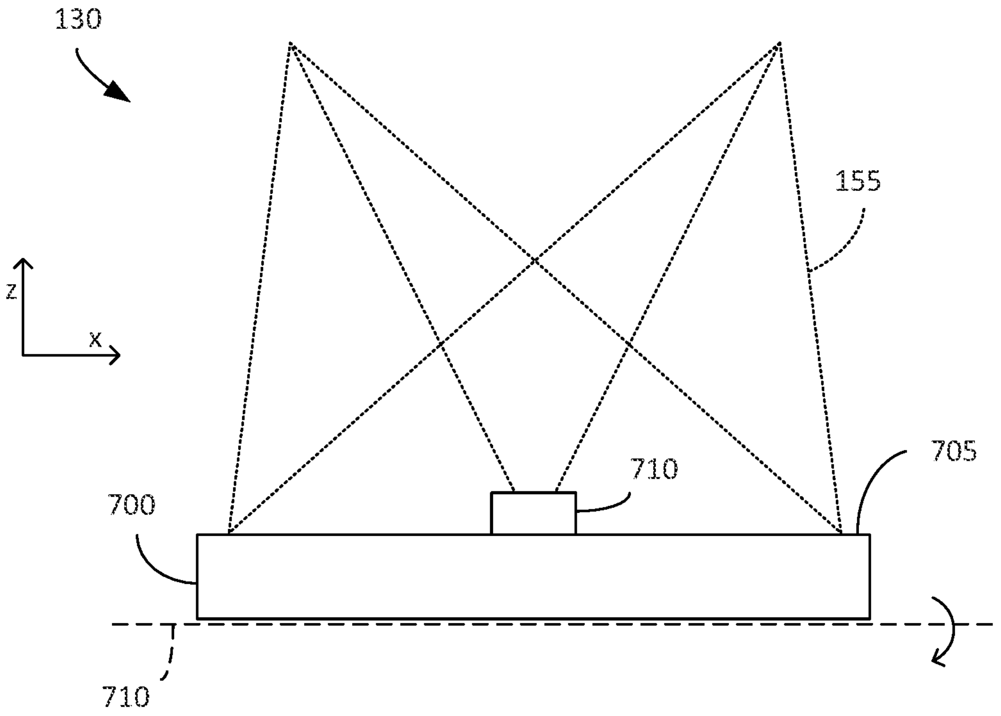
FIGS. 7A-7B illustrate a camera assembly of the MicroED system of FIG. 1 in accordance with some embodiments.
Figure 7B:
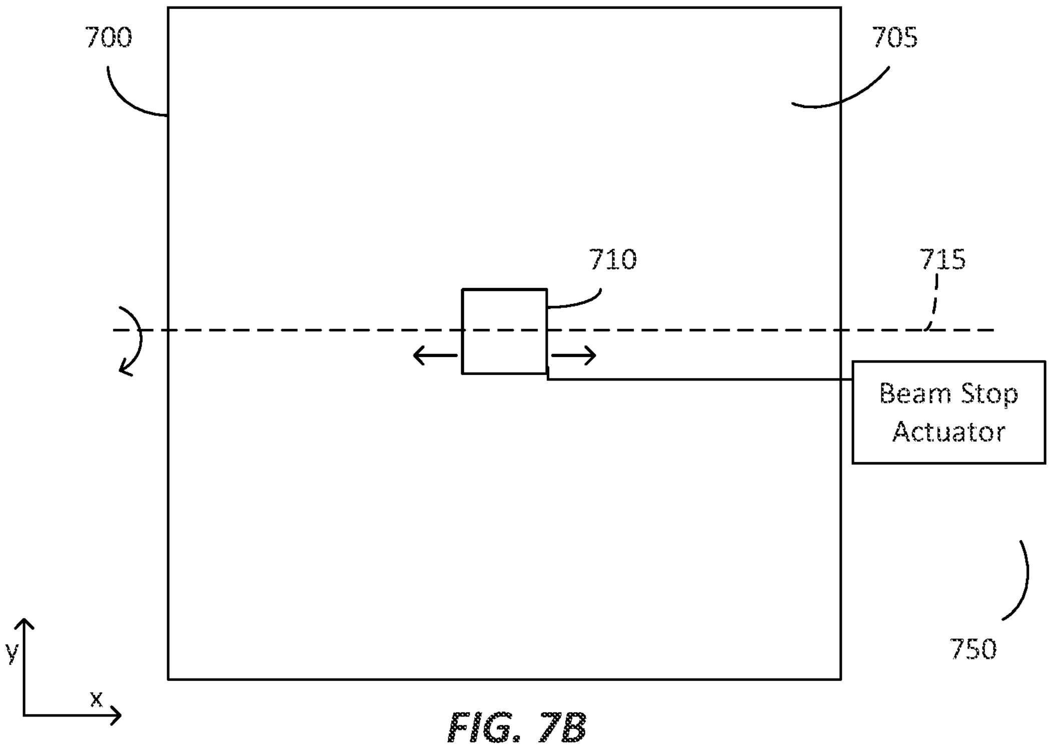

FIGS. 7A-7B illustrate an example of the camera assembly 130. FIG. 7A shows a side view of the camera assembly 130, and FIG. 7B illustrates a top-down view (e.g., with reference to FIG. 1, from the perspective of the post-sample lens assembly 125 looking down toward the camera assembly 130). As noted above, during the course of a MicroED operation, the camera assembly 130 captures images, in response to control signals from the control system 135, of the diffraction patterns 155 generated as the sample stage 600 is rotated. The camera assembly 130 further provides the images to the control system 135 for one or more of storing, processing, displaying, and transmission. As described in further detail with respect to block 1125 in FIG. 11, the control system 135 further stores characteristic data with each image.

In some embodiments, the camera assembly 130 includes a CMOS detector 700 (or detector of another imaging technology) that is one or more of capable of counting up to 64 electrons over a large/high dynamic range, having a detective quantum efficiency near 1, a pixel array 705 of at least 2000×2000 pixels (2k×2k resolution), a physical pixel size of less than 40 micrometers, a speed of at least 1000 frames per second, a eucentricity of less than 200 nanometers over 180 degrees, and a camera beam stop with faraday cup 710 (herein beam stop 710). In some embodiments, a detector of the camera assembly 130 has a different electron counting capability, a different quantum efficiency, a pixel array having a different number of pixels, different shape, or different pixel size, a different capture speed, a different eccentricity value or range, and/or no beam stop with faraday cup. In embodiments including the beam stop 710, the faraday cup of the beam stop 710 is configured to measure flux and generate an output to the control system 135 indicative of the amount of flux measured. For example, the beam stop 710 may output to the control system 135 an indication of the flux detected as an electron dose measured in electrons per square angstrom (e−/Å$^2$) per second).

Additionally, the CMOS detector 700 and beam stop 710 can be configured to rotate about a rotation axis 715. Such rotation may be in addition to or instead of rotation of the sample, and may even be coordinated with the rotation of the source. The rotation of the CMOS detector 700 may be controlled by the control system 135. The CMOS detector 700 is aligned with the other components of the MicroED system 100 such that the optical axis of the MicroED system 100 crosses through the center of the rotation axis 715.

During operation, the beam stop 710 is generally aligned with the center of the electron beam 110 to, for example, block the most intense part of the electron beam 110 from reaching the pixel array 705. Without the beam stop 710, the electron beam 110 may washout the pixel array 705 or otherwise obscure the diffraction pattern 155. In some embodiments, a beam stop actuator 750 is provided that is configured to shift the position of the beam stop 710 (including the associated faraday cup) in a direction parallel to the rotation axis 715 (e.g., along the x-axis in FIG. 7B). The beam stop actuator 750 may be a piezo motor under the control of the control system 135. In some operations, the beam stop actuator 750 may be controlled to shift the beam stop 710 to one side of the pixel array 705, but the alignment of the beam stop 710 may remain with the center part of the electron beam 110 (i.e., the electron beam 110 may be aligned with the side of the pixel array to which the beam stop 710 has been shifted). In these operations, the MicroED system 100 may capture one side of the diffraction pattern 155 and rely on symmetry of the diffraction pattern to extrapolate the other side of the diffraction pattern 155. With this technique, the MicroED system 100 may, in effect, provide an additional level of magnification.

Figure 8A:
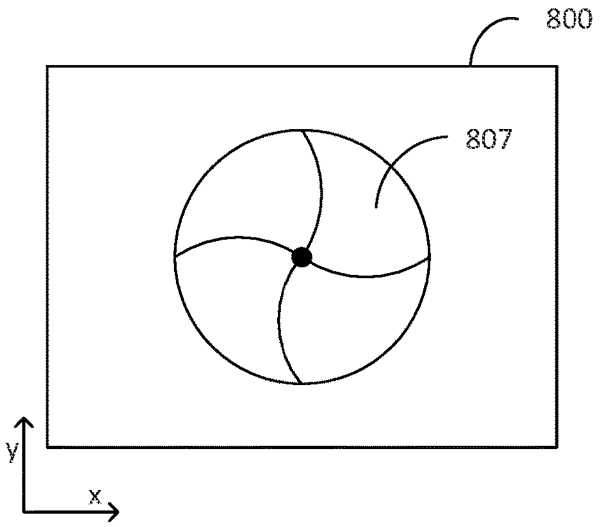
FIGS. 8A-8D illustrate examples of apertures for use in the MicroED system of FIG. 1 in accordance with some embodiments.
Figure 8B:
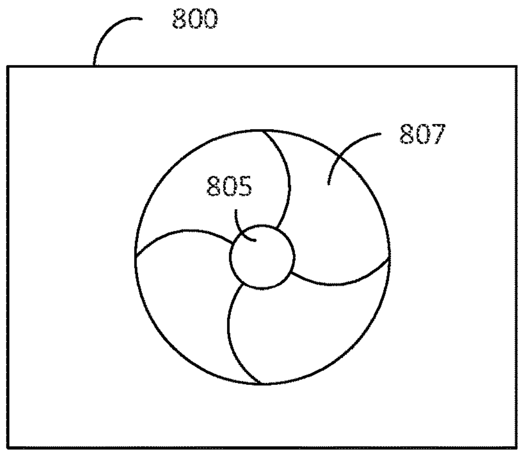

FIGS. 8A-8D illustrate two examples of controlled apertures, either of which may be used as one or more of the aperture 420 (FIG. 4), aperture 425 (FIG. 4), or aperture 505 (FIG. 5). More particularly, FIGS. 8A-8B illustrate an iris aperture 800 in a closed position in FIG. 8A and in an open position in FIG. 8B. In some embodiments, the iris aperture 800 has a circular opening 805 with a diameter configured to be controlled to a size within a continuous range of between 0 micrometers (when closed) to 100 micrometers (when fully opened). The iris aperture 800 is controlled by control signals from the control system 135 to close and to open shutters 807 to control the opening 805 to be a specified size within the continuous range. In some embodiments, the iris aperture 800 has a different maximum diameter.

Figure 8C:
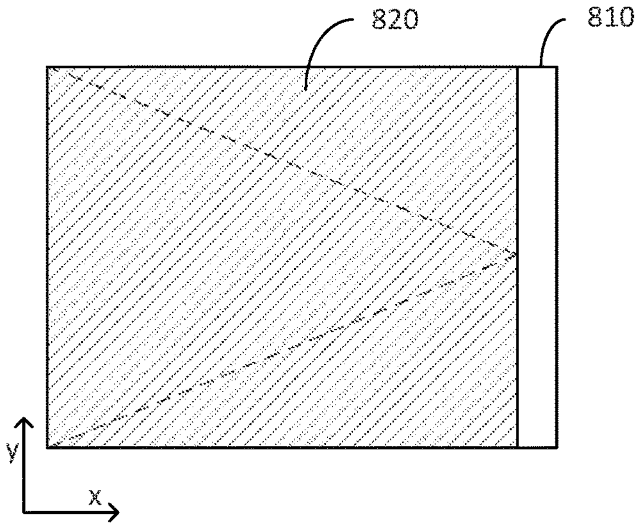
Figure 8D:
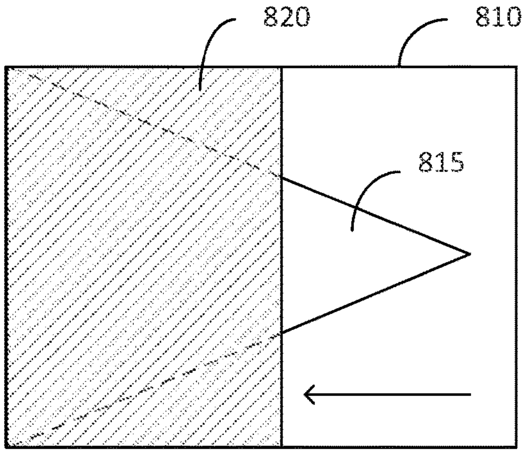

FIGS. 8C-8D illustrate a blade aperture 810 in a closed position in FIG. 8C and in an open position in FIG. 8D. In some embodiments, the blade aperture 810 has a triangular opening 815 that is revealed as a blade 820 slides laterally (in the left-right direction in FIGS. 8C-8D). By varying the lateral position of the blade 820, the size of the triangular opening 815 is changed. The control system 135 is configured to control the blade 820 along a continuous range of lateral positions between 0 micrometers (when closed) to 100 micrometers (when fully opened to the left). In some embodiments, the blade aperture 810 has a different maximum size opening 815.

Figure 9:
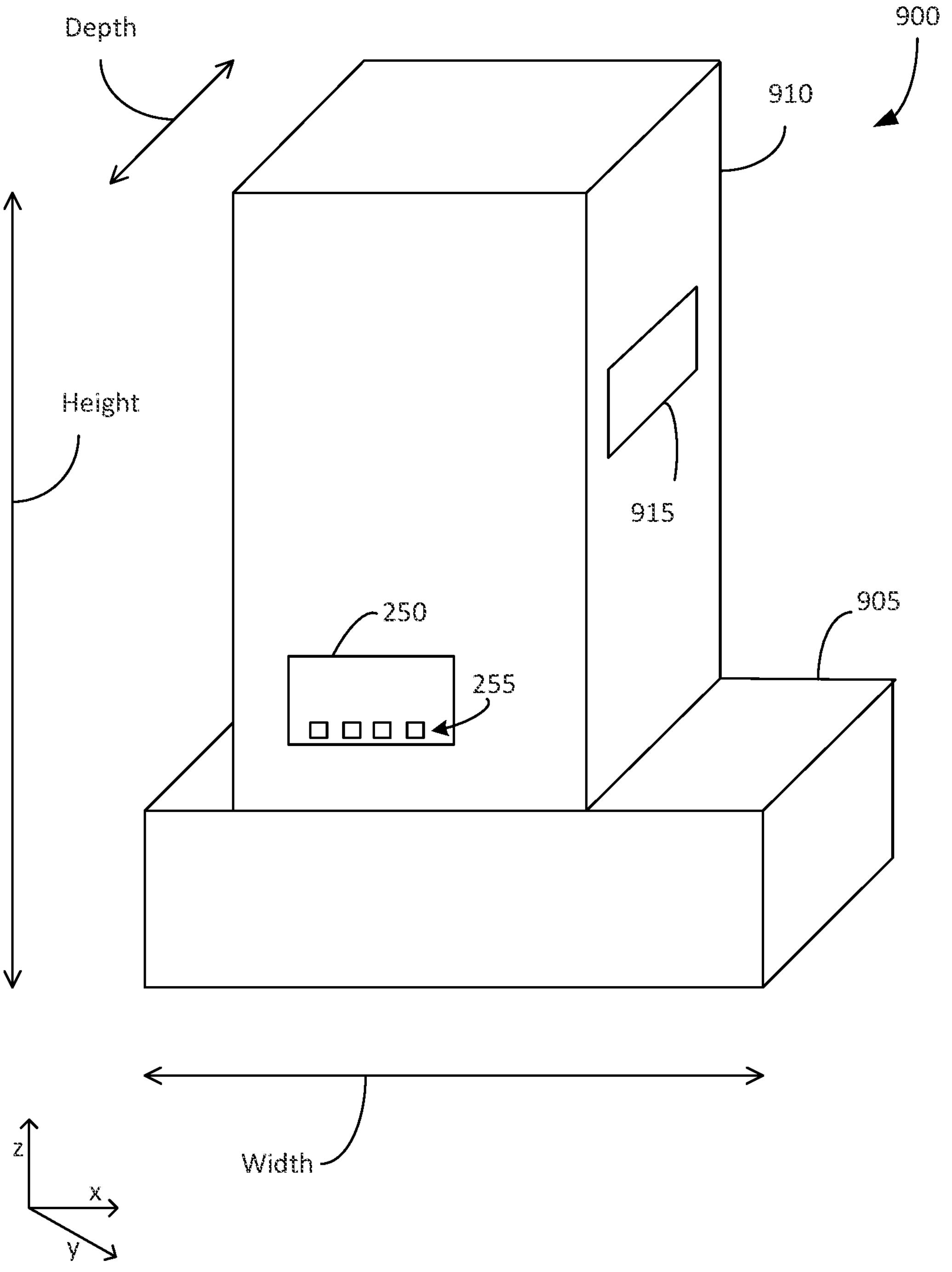
FIG. 9 is a perspective view of the MicroED system of FIG. 1 in accordance with some embodiments.

FIG. 9 illustrates a perspective view of an embodiment of the MicroED system 100 having a housing 900 including a base 905 and a tower 910. Within the housing 900 are the components of the MicroED system 100 illustrated in FIG. 1, as well as additional power conditioning circuitry, power buses and wiring, and communication buses and wiring for powering and enabling communication between the components. In some embodiments, the MicroED system 100 (e.g., as shown in FIG. 9) is an all-in-one unit entirely housed within the housing 900, such that the MicroED system 100 does not need to be coupled to additional servers or processors to generate or process image data. Rather, upon coupling of the MicroED system 100 to a power source (e.g., a standard 120 or 240 volt wall outlet) via a power cord (not shown), the MicroED system 100 is capable of performing a MicroED operation. More particularly, the MicroED system 100, as a standalone unit, is configured to pre-screen samples, collect image data from the camera assembly 130 at the control system 135, process the image data by the control system 135, and output MicroED output data (e.g. on the display 250), as described in further detail with respect to processes 1000 of FIG. 10, 1100 of FIG. 11, 1200 of FIG. 12, and 1400 of FIG. 14.

The base 905 supports the tower 910 and may include vibration isolation elements (not shown) to isolate the MicroED system 100 from external vibration and/or to isolate the tower from vibration generated by the base 905; power circuitry (e.g., transformers, filters, and other conditioning circuitry to provide source power to components of the MicroED system 100); the control system 135; and the vacuum system 142. In some embodiments, the tower 910 includes the display 250 in the form of a touch screen display, which further includes the preset selector 255 (e.g., in the form of graphical soft keys). In some embodiments, the tower 910 further includes a sample insertion port 915 enabling insertion and removal of specimens (e.g., see specimen 605 in FIG. 6) for analysis. The insertion portion 915 may provide access to an interlock chamber having an outer door linking the interlock chamber the outside of the tower 910 and an inner door linking the interlock chamber to the vacuum chamber in which the sample stage 600 is imaged.

In some embodiments, the base 905 houses the control system 135, the vacuum system 142 configured to produce the vacuum within the tower 910, and the power circuitry configured to provide power to the electron source 105, the camera assembly 130, and the vacuum system 142, and the other powered components of the MicroED system 100 supported by the housing 900. The vacuum system 142 within the base 905 may include the turbo pump and other elements configured to generate the vacuum for the MicroED system 100, while the sealed area in which the vacuum exists may be located within the tower 910 and connected (e.g., through a conduit) to the vacuum system 142 in the base 905. Additionally, in some embodiments, the tower 910 houses the electron source 105, the sample assembly 120, the camera assembly 130, the condenser lens assembly 115, and the post-sample lens assembly 125. Although the base 905 and the tower 910 are illustrated as having generally cuboid-shapes, in some embodiments, one or both of the base 905 and the tower 910 have a different shape.

Although the MicroED system 100 may be a self-contained unit, in some embodiments, the MicroED system 100 is configured to communicate with remote computing devices (e.g., servers, tablets, smart phones, desktop computers, laptops, and the like) via the control system 135 and input/output interface 210 to share or store results of MicroED operations. Such communications may be encrypted and may occur via a fiber optic connection of the input/output interface 210 or other suitable communication interface.

In some embodiments, because of the particularly customized components for MicroED operations, the overall size of the MicroED system 100 and housing 900 is reduced relative to microscopes that may otherwise be used for MicroED operations. For example, in some embodiments, the overall height 920 of the housing 900 is six feet or less (e.g., between 48, 60, or 66 to 72 inches) the depth 925 is two feet or less (e.g., between 18 or 21 to 24 inches), and the width 930 is three feet or less (e.g., between 24 or 30 to 36 inches). For example, because of the lower power requirements for the electron source 105, as compared to other electron microscopes, smaller power supplies may be provided. Additionally, the MicroED system 100 does not have as specific operating environmental conditions as other electron microscopes, precise and expensive heating, ventilation, and air conditioning (HVAC) systems or water-cooling systems are not required. Further, because of a pre-screening process used by the MicroED system 100 (described in further detail below), certain lenses used to create focused (non-diffraction mode) images of samples in a typical TEM system may be eliminated in the MicroED system 100. That is, in some embodiments, the MicroED system 100 includes a reduced set of lenses (e.g., as illustrated in FIGS. 4-5), enabling a more compact design than a TEM system that includes additional lenses for imaging in a (non-diffraction) imaging mode.

Figure 10:
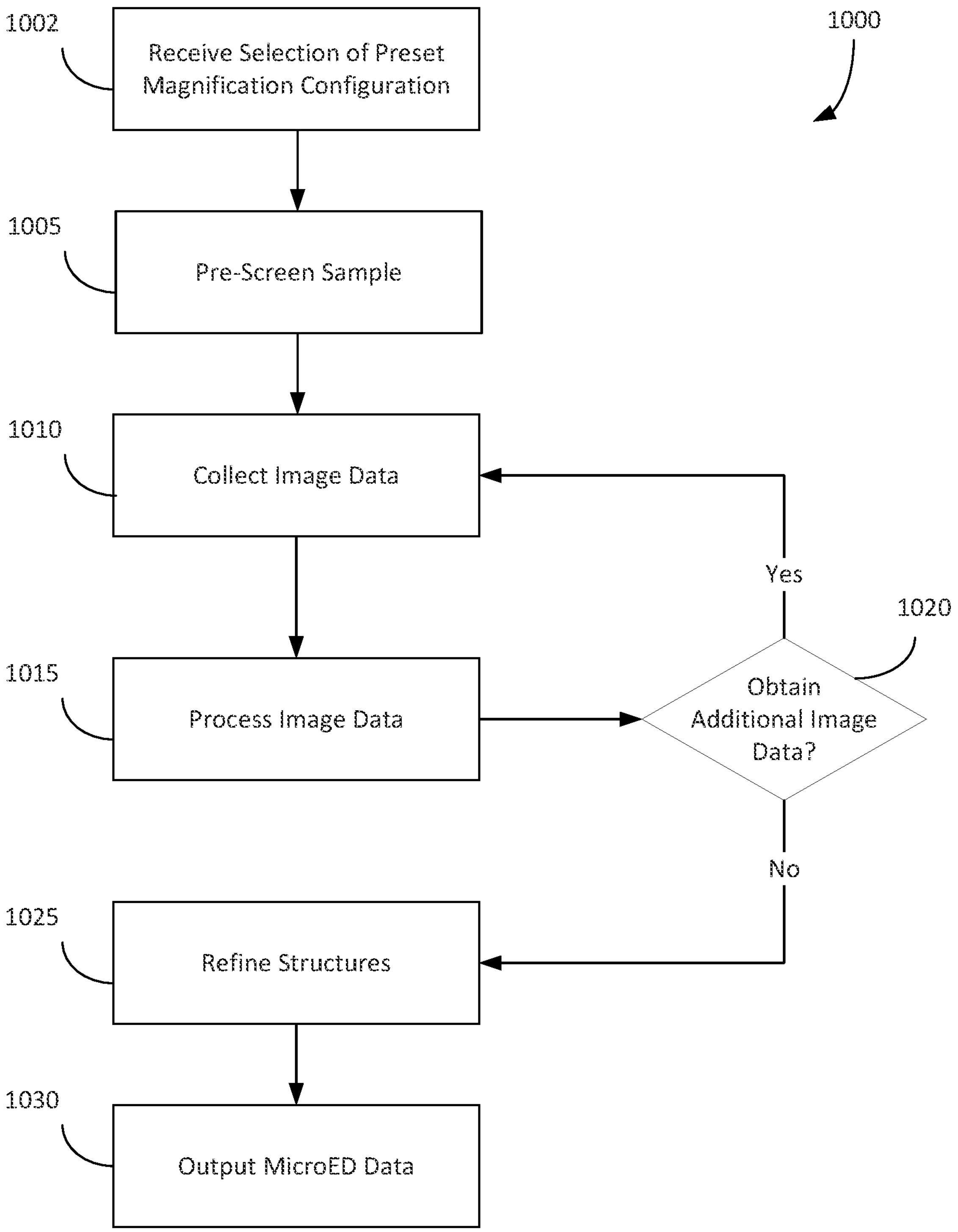
FIG. 10 illustrates a process for generating MicroED data using the MicroED system of FIG. 1 in accordance with some embodiments.

FIG. 10 illustrates a process 1000 for generating MicroED data. The process 1000 is described as being carried out by the MicroED system 100. However, in some embodiments, the process 1000 may be implemented by another MicroED system. Additionally, although the blocks of the process 1000 are illustrated in a particular order, in some embodiments, one or more of the blocks may be executed partially or entirely in parallel, may be executed in a different order than illustrated in FIG. 10, or may be bypassed.

In block 1002, the control system 135 receives a selection of one of a plurality of preset magnification configurations. For example, as noted above, the user input/output devices 140 may include a preset selector 255 that is configured to receive a selection of one preset magnification configuration from a plurality of preset magnification configurations (e.g., a preset magnification selected from the group of 200 mm, 500 mm, 800 mm, and 1200 mm). In response, the control system 135 controls one or both of the condenser lens assembly 115 and post-sample lens assembly 125 to the selected magnification preset configuration. To control the assembly(ies) to the selected magnification preset configuration, the control system 135 may control one or more of the actuators 430 and 530 to change the current provide to one or more of the lenses in the condenser lens assembly 115 and post-sample lens assembly 125 to one or more predetermined values.

In some embodiments, in block 1002, one or more additional operational parameters for the MicroED operation is received by the control system 135 via the user input/output devices 140. The operational parameters may include a sample rotation speed, sample rotation angular displacement (e.g., +/−30° or 70°), electron dose, beam size, electron beam energy spread, among other parameters. In response, the control system 135 configures the MicroED system 100 according to the operational parameters in advance of collection of image data and/or during the collection of image data.

The range of selectable values for each operational parameter may be limited to a range associated with MicroED operations, rather than a larger range of values that may include levels conducive to other (non-MicroED) types of electron microscopy operations. Such other settings, if attempted in the MicroED context, may produce unintelligible or inferior MicroED data or may damage the sample (e.g., when an electron dose is above a certain level). Accordingly, the control system 135 may prevent, for example, a user from selecting a magnification setting outside of the preset magnification configurations, a rotation rate that is too fast or too slow for MicroED operations or an electron dosage that is too high or too low for MicroED operations. Examples of such ranges of selectable values for operational parameters is provided elsewhere herein when discussing the particular parameters. Additionally, in some embodiments, one or more of the other operational parameters are automatically determined in a pre-screening step (see block 1005) or are configured in an initial setup of the MicroED system 100 and are generally not changed between imaging of different samples.

In block 1005, the control system 135 pre-screens a sample (e.g., specimen 605) that has been received by the sample assembly 120 on the sample stage 600 (e.g., via the sample insertion port 915 shown in FIG. 9). By pre-screening the sample, the control system 135 is configured generate and analyze image data to determine a particular x, y position for the sample stage 600 during a MicroED operation that provides sufficient diffraction onto the camera assembly 130 to enable generating quality MicroED data. The control system 135 may further control the sample stage 600 to the particular x-y position determined during the pre-screening of the sample. An example of a pre-screening process 1200 is described in further detail with respect to FIG. 12, although other pre-screening processes may be performed in some embodiments.

In block 1010, the control system 135 controls the MicroED system 100 to collect image data. FIG. 11 illustrates a process 1100 for collecting image data that may be used to implement block 1010 of FIG. 10, at least in some embodiments. As explained below, in the process 1100, an image is captured and tagged with characteristic data to form a diffraction image, which may be returned as the image data for block 1010. The linking of characteristic data to a captured image in the form of a diffraction image simplifies tracking of image data generated during rotation of the sample stage 600, which simplifies the processing of the image data to generate the MicroED output in the process 1000 of FIG. 10.

With reference to FIG. 11, in block 1105, the control system 135 rotates the sample stage to an initial rotational position. For example, when the control system 135 is configured to generate MicroED data by rotating the sample stage 600 from −70° to +70° about the axis 615 (see FIG. 6), the control system 135 may store an initial rotational position (e.g., −70°) and an end rotational position (e.g., +70°) specifying the desired rotational displacement of the sample during the MicroED operation (collectively, the rotational position parameters) in the memory 205. Accordingly, in block 1105, the control system 135 is configured to control the actuator 610 (see FIG. 6) to rotate the sample stage 600 to the initial rotational position.

In block 1110, the control system 135 controls the electron source 105 to generate the electron beam 110. For example, the control system 135 provides controls signal to the electron source 105 indicating one or more of a power level and duration for the electron beam 110. In response, the electron source 105 generates an electron beam 110 in accordance with the control signals (e.g., at the indicated power level and/or duration).

In block 1115, the control system 135 controls the apertures of the MicroED system 100 to momentarily open. For example, the control system 135 controls the first aperture 420 and the second aperture 425 to momentarily open to allow the electron beam 110 to pass through to the sample stage 600, and controls the third aperture 505 to momentarily open to allow the scattered beam 150 to pass through to the lenses of the post-lens assembly 125 and, ultimately, the camera assembly 130. The control system 135 further controls these apertures 420, 425, and 505 to close to limit the exposure of the camera assembly 130 to electrons. In some embodiments, to control the apertures to momentarily open and close, the control system 135 sends respective actuation signals to the aperture actuators 435 and 535 to cause the respective apertures 420, 425, and 505 to open and, after a certain duration, sends respective actuation signals to the aperture actuators 435 and 535 to cause the respective apertures 420, 425, and 505 to close.

In block 1120, the control system 135 controls the camera assembly 130 to capture an image of the diffraction pattern 155 (see FIGS. 1 and 7) that occurs while the apertures are momentarily opened in block 1115. For example, with reference to FIG. 7, the CMOS detector 700 generates signals at each pixel of the pixel array 705 that, collectively, form an image that represent the diffraction pattern 155 received by the camera assembly 130. The image is then output by the camera assembly 130 (e.g., by the CMOS detector 700) to the control system 135. The control system 135 stores the image, at least temporarily (e.g., in a buffer, registers, as a temporary file in the memory 205).

In block 1125, the control system 135 tags the image and stores it as a diffraction image in the memory 205. To tag the image, the control system 135 associates characteristic data with the image, such as by adding the characteristic data as a header or otherwise as metadata to the image. The resulting diffraction image, including both the image and characteristic data, may take the form as of a proprietary file format. The characteristic data may include one or more of the following: current time (time stamp), time of exposure start (when all aperture are open), time of exposure end (when any one of the apertures first closes), preset magnification setting, wavelength of electron beam 110, diffraction length, rotation axis, rotation speed, rotation angle of the sample stage 600, flux measurement from faraday cup of beam stop 710, ratio of incident beam and diffracted beam, as well as other characteristics and operational parameters of the MicroED system 100. In some embodiments, the characteristic data is determined by the control system 135 contemporaneously with or immediately after the capture of the diffraction image in block 1120. For example, a portion of the characteristic data may include operational parameters obtained from the memory 205, a portion of the characteristic data may be sensed during the image capture (e.g., flux measurement from beam stop 710), and a portion of the characteristic data may be determined from other data sources (e.g., time values from a real time clock of the control system 135). The diffraction image may be stored in the memory 205 as part of the image data 225 (see FIG. 2).

In block 1130, the control system 135 determines whether the sample stage 600 has reached the end rotational position. For example, as previously noted, the control system 135 is configured to monitor the rotational position of the sample stage 600 using either open loop control or feedback from closed loop control. Accordingly, in some embodiments, the control system 135 compares the current rotational position of the sample stage 600 to the end rotational position to determine whether the sample stage 600 has reached the end rotational position. When the sample stage 600 has not yet reached the end rotational position, the control system 135 proceeds to block 1135 and controls the actuator 610 to rotate the sample stage 600 by an increment angle (e.g., 0.5°, 1.0°, 2°, 5°, etc.). The increment angle may be specified in operational parameters in the memory 205 in an advanced setup stage or in block 1002 of FIG. 10. The control system then returns to block 1110 to continue generating the electron beam 110 or to start generating the electron beam 110 again.

The control system 135 loops through blocks 1100-1135 incrementally rotating the sample stage 600 while generating and storing diffraction images until determining, in block 1130, that the sample stage 600 has reached the end rotational position. When the sample stage 600 has reached the end rotational position, the control system exits the process 1100 and returns to block 1015 of FIG. 10.

Although the process 1100 illustrates that controlling the rotation of the sample stage 600 is performed incrementally in conjunction with each image capture, in some embodiments, during the course of an operation, the rotation of the sample stage 600 and image capture are independent of one another. For example, the control system 135 may control the rotation of the sample stage 600 at a linear speed, as previously described, and independent of individual image captures by the camera assembly 130. Further, during the course of the rotation of the sample stage 600, the camera assembly 130 is capturing images (or movie frames) at a specified frame rate (e.g., between 0.1 to 1000 frames per second). However, as noted, the rotational position of the sample stage 600 may be repeatedly determined and stored along with each captured image such that, for each diffraction image, the control system 135 may determine the rotational position of the sample stage 600 at the point of the image capture, which can be used when processing the images. By decoupling the rotation and image capture, each can be controlled at known, constant rates, providing quality image data that can be processed by image processing software to generate MicroED data, as discussed herein.

In block 1015, the control system 135 processes the image data obtained in block 1010, which includes the diffraction images captured at the various rotational angles of the sample stage 600. Processing the image data may include the control system 135 combining the individual diffraction patterns of each crystal to generate a three dimensional image of the diffraction resulting from the MicroED operation on the sample. In some embodiments, the characteristic data stored with the image data as the diffraction images is used by the control system 135 in the processing of the diffraction images.

In some embodiments, to process the image data, the control system 135 processes each diffraction image to identify and index diffraction points. The control system 135 may identify diffraction points as a pixel (or group of pixels) within a diffraction image with an intensity above a threshold value, having a size within a certain range, and/or having a particular shape (e.g., circular). The control system 135 may then index each diffraction point by determining the x-y position of the diffraction point within the diffraction image, and associating the diffraction point of one diffraction image with the diffraction points within other diffraction images caused by the same diffraction instance (e.g., by the same diffracted portion of the electron beam 110). By determining the x-y positions of the associated diffraction points in each diffraction image, and knowing the rotation angle of the sample stage 600 of each diffraction image (e.g., based on the characteristic data of the diffraction image, such as the time stamp, frame rate, and rotation rate), the associated diffraction points from the multiple diffraction images can be mapped to a point within a virtual three-dimensional space. In other words, the diffraction instance may be mapped to a point within the reciprocal three-dimensional space. The control system 135 may further perform this processing to map each diffraction instance to the reciprocal three-dimensional space, thereby generating a three-dimensional diffraction pattern. In some embodiments, other three-dimensional reconstruction techniques are used to generate a three-dimensional diffraction pattern from the captured diffraction images.

In block 1020, the control system 135 determines whether additional image data is desired for the sample. For example, the control system 135 may analyze the diffraction patterns for the image data, or the three-dimensional diffraction pattern, and determine whether sufficient diffraction data has been captured in the image data. In some embodiments, a completeness parameter may be attributed by the control system 135 to the image data, and the completeness parameter may be compared to a threshold (e.g., 65%, 70%, or 75%) to determine whether sufficient diffraction data is present. Some crystals provide symmetric diffraction patterns that reduce the amount of data needed to generate a three-dimensional model of the diffraction data (e.g., because additional diffraction pattern data can be extrapolated from captured diffraction data based on the symmetry). When insufficient diffraction data is present for one or more of the diffraction images (e.g., which may be indicated by saturation of the pixel array 705 or lack of diffraction detection by the pixel array 705), the control system returns to block 1010 to collect further image data. When re-executing block 1010, the control system 135 may collect images for a subset of the rotational angles of the sample stage 600 (e.g., for those rotational angles in which insufficient diffraction data was obtained). In other embodiments, the control system 135 repeats the process to collect diffraction data for the entire set of rotational angles of the sample stage 600. In the case of multiple diffraction images for a particular rotational angle, the control system 135 may select the diffraction image (from the multiple diffraction images) having the larger amount of diffraction data (e.g., in the block 1015 when processing the image data). In some embodiments, the x-y position of the sample stage 600 is adjusted such that further crystals on the sample stage 600 are imaged to gain additional diffraction data.

When, in block 1020, the control system 135 determines that sufficient image data is present, the control system proceeds to block 1025 to refine structures generated from processing the image data. In some embodiments, refining structures may include one or more of: refining lens aberrations, refining electron scattering, refining shape function, mosaicity refinement, ewald sphere correction, correcting for diffraction astigmatism, beam movement correction, beam center correction, z-axis correction, eucentric height correction, eucentric drift correction, anisotropic diffraction correction, dose weighting for beam damage, dark current correction, dynamical refinement, and completeness padding. In some embodiments, one or more of these refinements occurs within block 1015 instead of or in addition to occurring in block 1025. In some embodiments, control system 135 includes software (e.g., fully integrated into the control system 135) to perform these refinements.

In block 1030, the control system 135 outputs MicroED data generated in the process 1000. As noted, outputting the MicroED data may include the electronic processor 200, for example, storing the three-dimensional image on the memory 205, displaying the three-dimensional image on the three-dimensional display 250, and/or transmitting the three-dimensional image to another device via the I/O interface 210 (e.g., for further storage, display, or dissemination). The MicroED data may include one or more of: 1) an atomic structure of a specimen, 2) a full identity of the specimen without prior knowledge, 3) information about sample components (e.g., if specimen is a mixture), 4) a percent (%) contamination of the specimen and identity of the contaminants, 5) purity information for the specimen, and 6) a three-dimensional graph of diffraction data generated from a combination of the obtained two-dimensional diffraction images. For example, the control system 135 may combine the obtained two-dimensional diffraction images to generate three-dimensional data for the sample (e.g., a three-dimensional graph of the diffraction data or a three-dimensional structure of a sub-micron protein). The three-dimensional data may be output as MicroED data and/or may be further analyzed and classified. For example, the three-dimensional data may serve as an input to a lookup table that links the input data to one or more outputs. For example, the three-dimensional data may be compared to a database of three-dimensional data sets to identify a closest match, where the database of three-dimensional data sets have associated therewith one or more of the atomic structure of a specimen, full identify of a specimen, information about sample components, percent contamination of the specimen and contaminant identities, and purity information.

Figure 12:
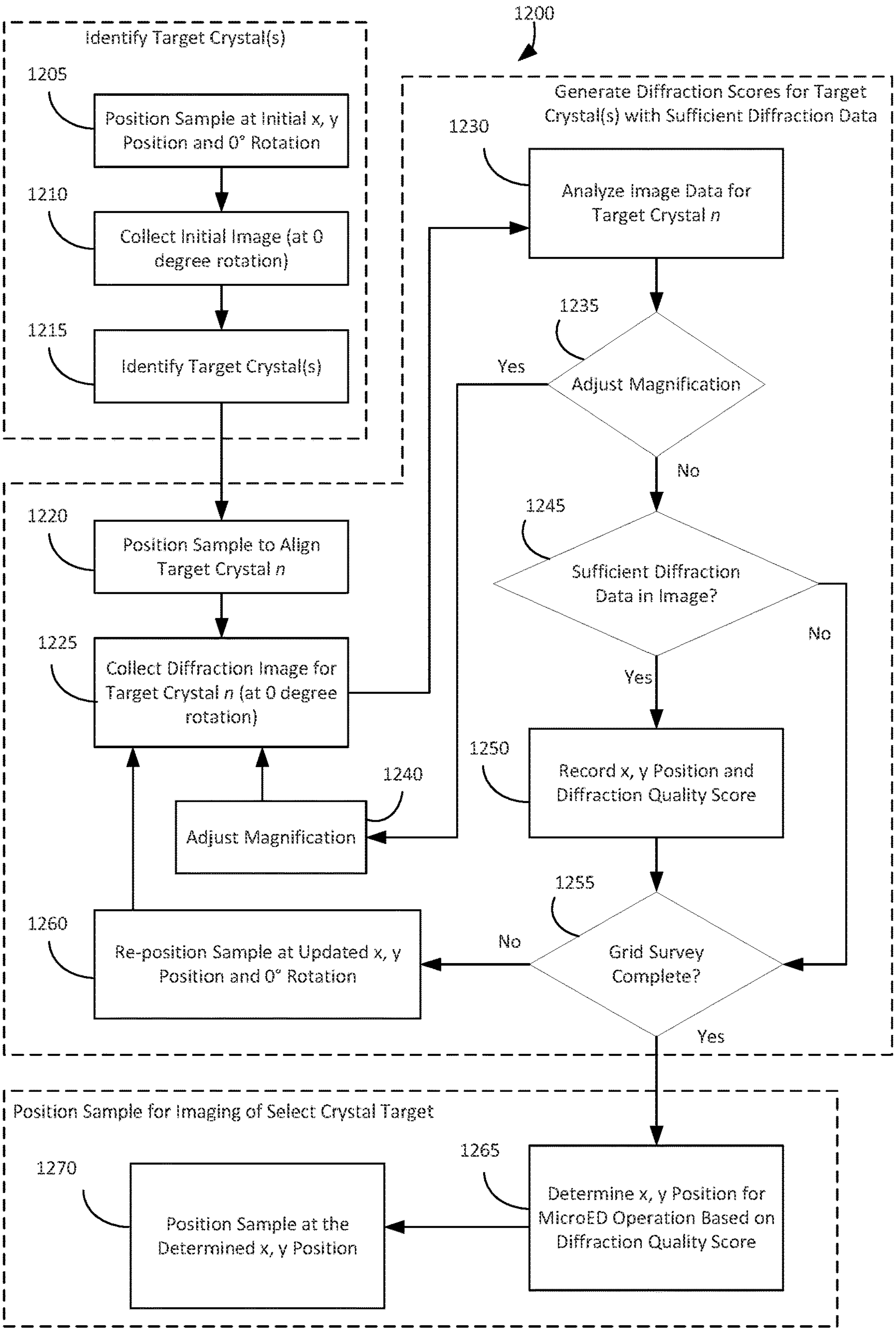
FIG. 12 illustrates a pre-screening process of the MicroED system of FIG. 1 in accordance with some embodiments.

FIG. 12 illustrates a pre-screening process 1200 of the MicroED system 100, according to some embodiments. Generally, the pre-screening process 1200 includes identifying one or more target crystals in a sample (see, e.g., blocks 1205, 1210, and 1215), generating diffraction scores for target crystal(s) with sufficient diffraction data (see, e.g., blocks 1220, 1225, 1230, 1235, 1240, 1245, 1250, 1255, and 1260), and then positioning the sample for imaging of a selected target crystal that provides sufficient diffraction data and based on the diffraction scores (see, e.g., blocks 1265 and 1270).

More particularly, in block 1205, the control system 135 controls one or more actuators (e.g., an x-dimension piezo motor and a y-dimension piezo motor of the x, y, z-dimension actuators 620 in FIG. 6) to position the sample stage 600 at an initial x-y position and at a rotational angle of 0 degrees (e.g., horizontal, as shown in FIG. 6). The control system 135 can control the sample stage 600 to be at a set of x times y different positions in the x-y plane. For example, where x=10 and y=10, the control system 135 can control the sample stage 600 to be at 100 different positions in the x-y plane. Of course, the number of x and y positions possible in the x-y plane for the sample stage 600 may be more or fewer than this example provides. The initial x-y position may be a centered position for the sample stage 600 (i.e., x=5 and y=5). In some embodiments, in block 1205, the control system 135 controls the condenser lens assembly 115 and the post-sample lens assembly 125 to a default magnification level (e.g., providing the lowest level of magnification).

In block 1210, the control system 135 collects an initial image for the sample stage 600. For example, the control system 135 may execute functions similar to blocks 1110, 1115, and 1120 in FIG. 11 to control the electron source 105 to generate an electron beam, control the apertures 420, 425, and 505 to momentarily open, and capture a diffraction image with the camera assembly 130. The initial image may be at a magnification level to capture multiple potential crystals on the sample stage 600. In the initial image, the crystals may appear as dark areas, while the carbon grid supporting the crystals may appear lighter.

In block 1215, the control system 135 identifies one or more target crystals in the initial image. For example, the control system 135 performs image processing on the initial image to identify dark areas (e.g., areas with pixels having an intensity level below a threshold). The control system 135 may further rank the likelihood that each dark area may be a crystal based on its size and pixel intensity level relative to the other dark areas and/or absolute thresholds. The controls system 135 then identifies one or more of the dark areas as target crystals (e.g., the darks areas found to be most likely to be a crystal), and an x-y position of each target crystal on the sample stage 600.

In block 1220, the control system 135 repositions the sample stage 600 to an x-y position to capture diffraction image data for a first target crystal (i.e., n=1). For example, the control system 135 may move the sample stage 600 so that the x-y position of the target crystal is centered with respect to the pixel array 705. In some embodiments, in block 1220, the control system 135 controls the condenser lens assembly 115 and the post-sample lens assembly 125 to a default magnification level for diffraction imaging (e.g., one of the preset magnification configurations).

In block 1225, the control system 135 collects diffraction image data for the target crystal n. For example, the control system 135 may execute functions similar to blocks 1110, 1115, 1120, and 1125 in FIG. 11 to control the electron source 105 to generate an electron beam, control the apertures 420, 425, and 505 to momentarily open, and capture a diffraction image with the camera assembly 130.

Figure 13A:
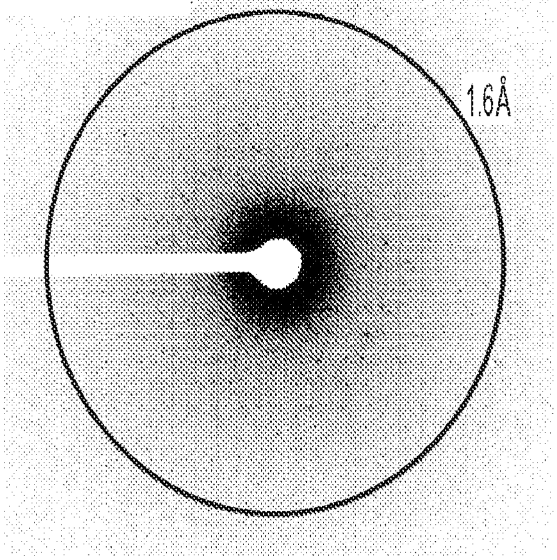
FIGS. 13A-13B illustrate example images generated during a pre-screening process of the MicroED system of FIG. 1 in accordance with some embodiments.
Figure 13B:
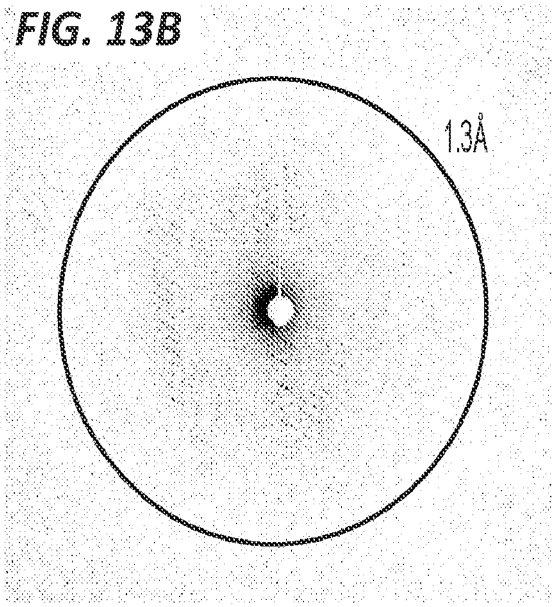
Figure 13C:
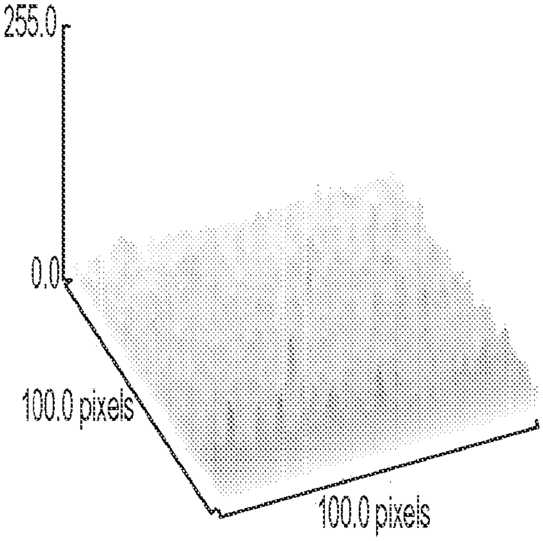
FIGS. 13C-13D illustrate example intensity plots for the images of FIGS. 13A-13B.
Figure 13D:
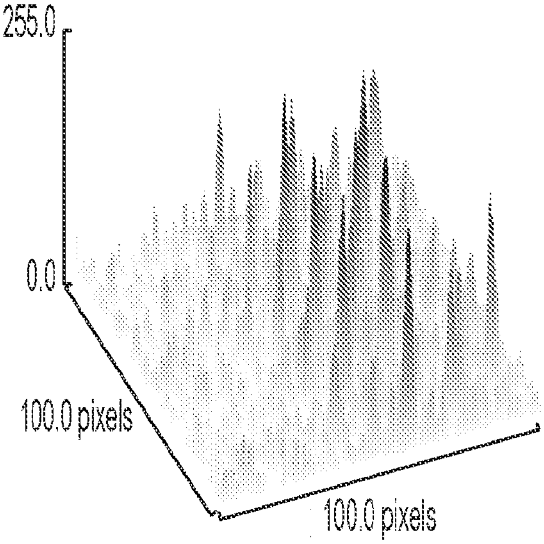

In block 1230, the control system 135 analyzes the image data of the diffraction image collected. The analysis may include the control system 135 quantifying the amount, quality, or both the amount and quality of diffraction data in the image data as a diffraction score. For example, the control system 135 may determine a brightness (or intensity) value, a signal-to-noise ratio, and/or a spread value of the diffraction data to serve as the diffraction score. For example, FIGS. 13A-B illustrate two diffraction images, and FIGS. 13C-D illustrate three-dimensional intensity plots (spot profiles) for the diffraction images of FIGS. 13A-B. The control system 135 may analyze the intensity plots of the diffraction images to determine an intensity value for the diffraction image (e.g., based on a statistical measure, such as an average, median, etc.). For example, the control system 135 would determine that the intensity value of the intensity plot of FIG. 13D is greater than the intensity value of the intensity plot of FIG. 13C because of the greater height and quantity of peaks in the intensity plot of FIG. 13D as compared to the intensity plot of FIG. 13C. The control system 135 may also analyze the intensity plots to determine a signal-to-noise ratio to evaluate the extent to which the diffraction data exceeds background noise on the pixel array 705. Generally, a higher signal-to-noise ratio increases a diffraction score for a diffraction image. The control system 135 may also analyze the intensity plots to determine a spread value for the diffraction image. For example, the less concentrated the peaks are in the intensity plot, the higher the spread value. Ultimately, the diffraction score may represent a resolution of the specimen that was captured in terms of Angstroms, where a lower Angstrom value (e.g., 1.3 Å, 1.2 Å or less) results in a better diffraction score than a higher Angstrom value (e.g., 1.5 Å, 1.6 Å, or greater).

In block 1235, the control system 135 determines whether to adjust the magnification configuration for the MicroED system 100. In some embodiments, the control system 135 may determine whether to adjust the magnification configuration based on the spread value for the diffraction image. For example, when the spread value is very high (e.g., above a first predetermined threshold), the magnification might be too great such that part of the diffraction pattern 155 is falling outside the perimeter of the pixel array 705 and not being captured as diffraction data. Conversely, when the spread value is too low (e.g., below a second predetermined threshold), the magnification might be too low such that the diffraction pattern 155 is impinging on only a small portion of the pixel array 705 and the diffraction data is overly concentrated. Accordingly, in some embodiments, when the spread value is above the first predetermined threshold or below the second predetermined threshold, the control system 135 determines to adjust the magnification of the MicroED system 100 and proceeds to block 1240.

In block 1240, the control system 135 adjusts the magnification of the MicroED system 100. For example, when the spread value is above the first predetermined threshold, the control system 135 controls the condenser lens assembly 115 and the post-sample lens assembly 125 to decrease the magnification level for diffraction imaging (e.g., by changing to another of the preset magnification configurations). Similarly, when the spread value is below the second predetermined threshold, the control system 135 controls the condenser lens assembly 115 and the post-sample lens assembly 125 to increase the magnification level for diffraction imaging (e.g., by changing to another of the preset magnification configurations). After adjusting the magnification, the control system 135 returns to block 1225 to capture a new diffraction image for the target crystal n with the modified magnification configuration. Accordingly, the control system 135 may execute blocks 1225, 1230, and 1235 in a loop until either the spread value is within the first and second predetermined thresholds or until no further predetermined magnification configurations are available (e.g., after the maximum or minimum magnification level has been used).

When, in block 1235, the control system 135 determines not to adjust the magnification configuration, the control system 135 proceeds to block 1245.

In block 1245, the control system determines whether sufficient diffraction data is present in the image data. For example, the control system 135 compares the diffraction score for the image data to a threshold. When the diffraction score exceeds a threshold, the control system 135 determines that sufficient diffraction data is present in the image data. In this case, the control system 135 proceeds to block 1250 to record the x and y position of the sample stage when the image data was collected, along with a diffraction score and magnification configuration. The control system 135 then proceeds to block 1255. Additionally, when, in block 1245, the control system 135 determines that insufficient diffraction data is present in the image data, the control system 135 proceeds to block 1255 without recording the x-y position and diffraction score.

In block 1255, the control system 135 determines whether further target crystals remain to be evaluated (i.e., n<total number of identified target crystals). When further target crystals are still to be evaluated, the control system 135 identifies the next target crystal to be evaluated in block 1260 (e.g., n=n+1), and then returns to block 1220 to reposition the sample stage to another x-y position to align the target crystal n.

The control system 135 continues to execute blocks 1220-1260 as described above until each of the target crystals has been evaluated. When, in block 1255, the control system 135 determines that each of the target crystals has been evaluated (i.e., when n=total number of identified target crystals), the grid survey is considered complete.

In block 1265, the control system 135 determines an x-y position for the sample stage 600 to be used during the MicroED operation based on the diffraction scores. For example, the control system 135 determines the x-y position by selecting the x-y position associated with the target crystal having with the highest diffraction score recorded in block 1230.

In block 1270, the control system controls the sample stage 600 to the determined x-y position. For example, the control system 135 controls one or more actuators (e.g., an x-dimension piezo motor and a y-dimension piezo motor of the x, y, z-dimension actuators 620) to position the sample stage 600 at the determined x-y position. In some embodiments, the control system 135 also controls the condenser lens assembly 115 and the post-sample lens assembly 125 to the preset magnification configuration for the particular target crystal (as recorded in block 1250).

By performing this automated pre-screening process 1200, the MicroED system (and, in particular, the control system 135) is configured to position the sample stage 600 is a location that is likely to result in a MicroED operation that provides sufficient diffraction data to enable generation of quality MicroED output (e.g., sufficient to provide 1) the atomic structure of a specimen, 2) the full identity of the specimen without prior knowledge, 3) information about sample components (e.g., if specimen is a mixture), 4) the percent (%) contamination of the specimen and identity of the contaminants, 5) and the purity information for the specimen.)

Additionally, in contrast to a TEM system that has an imaging mode and a diffraction mode, and that generates images of a sample in the imaging mode (requiring additional lenses) to identify crystals before proceeding to a diffraction mode, the pre-screening process 1200 uses diffraction images generated in a diffraction mode, and does so with a reduced quantity of lenses.

Figure 14:
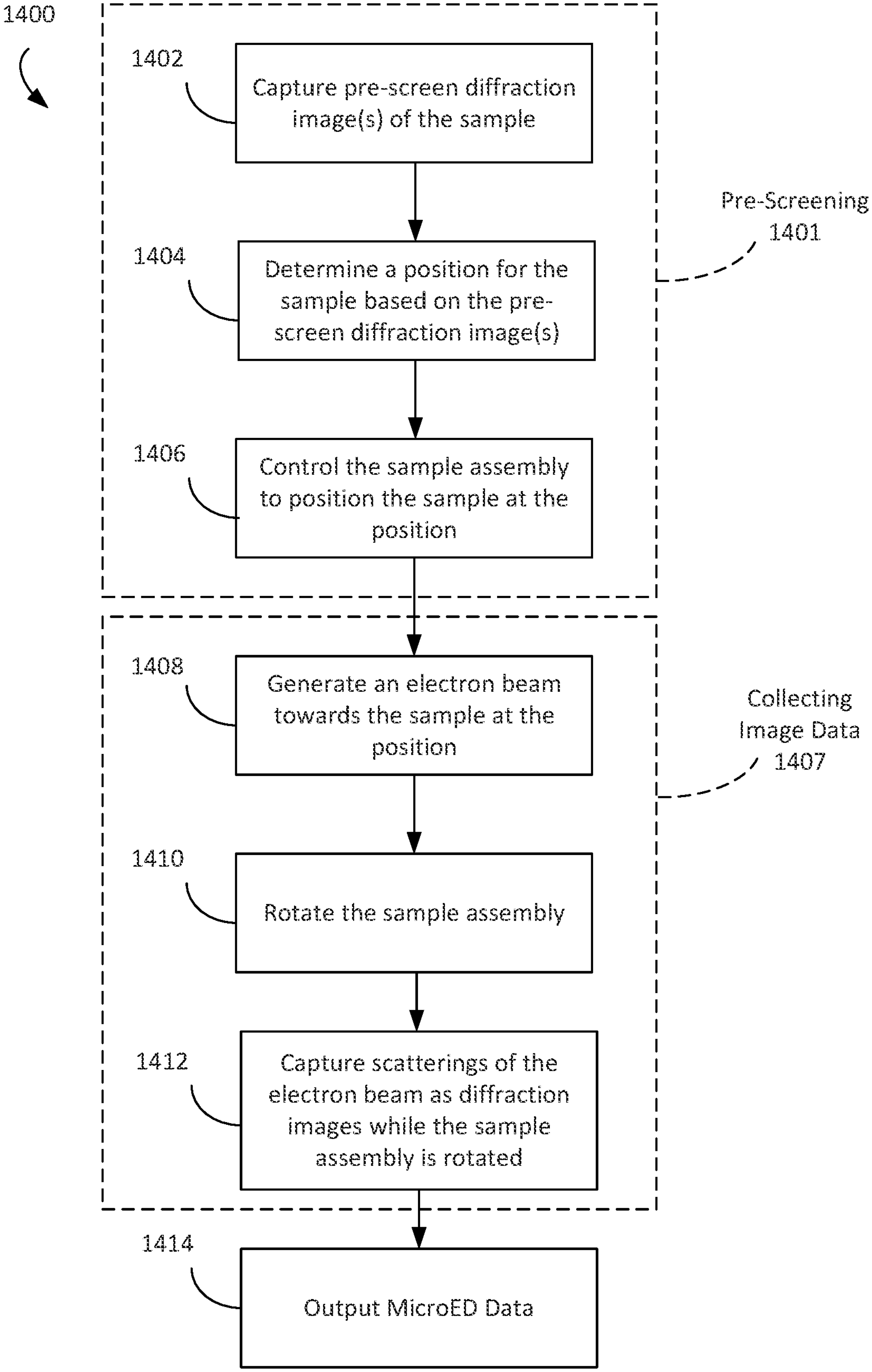
FIG. 14 illustrates another process for generating MicroED data using the MicroED system of FIG. 1 in accordance with some embodiments.

FIG. 14 illustrates a process 1400 for generating MicroED data. The process 1400 is described as being carried out by the MicroED system 100. However, in some embodiments, the process 1400 may be implemented by another MicroED system. Additionally, although the blocks of the process 1400 are illustrated in a particular order, in some embodiments, one or more of the blocks may be executed partially or entirely in parallel, may be executed in a different order than illustrated in FIG. 14, or may be bypassed.

In block 1401, the MicroED system 100 pre-screens a sample on a sample assembly (e.g., the specimen 605 on the sample stage 600 of the sample assembly 120 (see FIG. 6). Block 1401 may be similar to block 1005 of FIG. 10, and, accordingly, the pre-screening of block 1401 may be implemented by the process 1200 of FIG. 12, or portions thereof. For example, as illustrated, block 1401 includes blocks 1402, 1404, and 1406. In block 1402, the camera assembly 130 captures at least one pre-screen diffraction image of the sample. For example, the camera assembly 130 may capture one or more of the diffraction images described with respect to block 1215 of FIG. 12. In block 1404, the control system 135 determines a position for the sample for imaging based on the at least one pre-screen diffraction image. For example, the control system 135 may determine the position as described with respect to block 1265 of FIG. 12. In block 1406, the control system 135 controls the sample assembly to position the sample at the position. For example, the control system 135 may control the sample assembly to position the sample at the position as described with respect to block 1270 of FIG. 12.

In some embodiments, the pre-screening of block 1401 may include additional features, such as additional portions of the process 1200 of FIG. 12. For example, in some embodiments, the pre-screening of block 1401 further includes identifying m target crystals of the sample on the sample assembly, where m≥1 (see blocks 1205, 1210, and 1215 of FIG. 12). Additionally, the pre-screening of block 1401 may further include generating a respective diffraction score for at least one of the m target crystals based on respective diffraction images of the m target crystals (see blocks 1220-1260 of FIG. 12). For example, for each of the m target crystals having sufficient diffraction data in a corresponding diffraction image (see block 1245), a diffraction quality score (e.g., a diffraction score) may be recorded along with an x, y position of the target crystal (see block 1250). In some examples, generating the respective diffraction scores also includes magnification adjustment (see blocks 1235 and 1240). The pre-screening of block 1401 may further include selecting one of the m target crystals for imaging based on the diffraction scores (see block 1265). For example, the control system 135 may select the target crystal and/or corresponding sample position having the highest diffraction score. The selected one of the m target crystals corresponds to the position for the sample for imaging (see block 1270, where the sample is positioned at the determined position for the selected target crystal).

In block 1407, the MicroED system 100 collects image data of the sample (e.g., the specimen 605). Block 1407 may be similar to block 1010 of FIG. 10, and, accordingly, the collection of image data in block 1407 may be implemented by the process 1100 of FIG. 11, or portions thereof. For example, as illustrated, block 1407 includes blocks 1408, 1410, and 1412. In block 1408, the electron source generates an electron beam towards the sample at the position.

In block 1410, the control system 135 controls the sample assembly to rotate. In block 1412, the camera assembly captures scatterings of the electron beam by the sample as diffraction images while the sample assembly is rotated. Blocks 1410 and 1412 may be implemented as described with respect to blocks 1120 (capture image) and 1135 (rotate sample stage by increment angle) of FIG. 11. Although the rotation of block 1410 may be performed incrementally in conjunction with each image capture in block 1412, as initially described with respect to FIG. 11, as also provided with respect to the process 1100, in some embodiments, the rotation of the sample stage 600 and image capture may be independent of one another. That is, the rotation and image capture of blocks 1410 and 1412 may be decoupled from one another such that during the course of the rotation of the sample assembly in block 1410, the camera assembly 130 is capturing images (or movie frames) at a specified frame rate (e.g., between 0.1 to 1000 frames per second) in block 1412. The rotational position of the sample assembly may be repeatedly determined and stored along with each captured image such that, for each diffraction image, the control system 135 may determine the rotational position of the sample assembly at the point of the image capture, which can be used when processing the images.

In some embodiments, collecting the image data may further include tagging the diffraction images that are captured, such as described with respect to block 1125 of FIG. 11.

In block 1414, the control system 135 outputs microcrystal electron diffraction data based on the image data. Block 1414 may be similar to block 1030 of FIG. 10. For example, the control system 135 may process the image data to identify and index diffraction points in the diffraction images of the image data (see block 1015), refine the structures (see block 1025), and then output the microcrystal electron diffraction data based on the processing of the image data and/or refining of the structures. The output microcrystal electron diffraction data may include one or more of the following: an atomic structure of the sample, an identity of the sample, an identification of components of the sample, an amount of contamination of the sample, an identification of contaminants of the sample, and a three-dimensional graph of diffraction data generated from a combination of the diffraction images. In the context of the output data, the sample may refer to, e.g., the specimen 605 or target crystal corresponding to the position determined in block 1404.

In some embodiments, the process 1400 may further include one or more of: receiving a selection of a preset magnification configuration (similar to block 1002 of FIG. 10), processing the image data collected (similar to block 1015 of FIG. 10), determining whether to obtain additional image data (similar to block 1020), refining structures (similar to block 1025 of FIG. 10), and/or any of the other blocks of FIGS. 10, 11, and 12.

The present disclosure has described one or more embodiments as non-limiting examples, and it should be appreciated that many equivalents, alternatives, variations, and modifications, aside from those expressly stated, are possible and within the scope of the application. Features of the disclosed non-limiting examples can be combined and rearranged in various ways. Furthermore, the non-limiting examples of the disclosure provided herein are not limited in application to the details of construction and the arrangement of components set forth in the description or illustrated in the drawings. The embodiments are capable of being practiced or of being carried out in various ways.

Also, it is to be understood that the phraseology and terminology used herein is for the purpose of description and should not be regarded as limiting. The use of “including,” “comprising,” or “having” and variations thereof herein is meant to encompass the items listed thereafter and equivalents thereof as well as additional items. Unless specified or limited otherwise, the terms “mounted,” “connected,” “supported,” and “coupled” and variations thereof are used broadly and encompass both direct and indirect mountings, connections, supports, and couplings. Further, “connected” and “coupled” are not restricted to physical or mechanical connections or couplings.

Also, the use the phraseology and terminology used herein is for the purpose of description and should not be regarded as limiting. The use of “right”, “left”, “front”, “back”, “upper”, “lower”, “above”, “below”, “top”, or “bottom” and variations thereof herein is for the purpose of description and should not be regarded as limiting. Unless specified or limited otherwise, the terms “mounted,” “connected,” “supported,” and “coupled” and variations thereof are used broadly and encompass both direct and indirect mountings, connections, supports, and couplings. Further, “connected” and “coupled” are not restricted to physical or mechanical connections or couplings.

Unless otherwise specified or limited, phrases similar to “at least one of A, B, and C,” “one or more of A, B, and C,” etc., are meant to indicate A, or B, or C, or any combination of A, B, and/or C, including combinations with multiple or single instances of A, B, and/or C.

In some non-limiting examples, aspects of the present disclosure, including computerized implementations of methods, can be implemented as a system, method, apparatus, or article of manufacture using standard programming or engineering techniques to produce software, firmware, hardware, or any combination thereof to control a processor device, a computer (e.g., a processor device operatively coupled to a memory), or another electronically operated controller to implement aspects detailed herein. Accordingly, for example, non-limiting examples of disclosed embodiments can be implemented as a set of instructions, tangibly embodied on a non-transitory computer-readable media, such that a processor device can implement the instructions based upon reading the instructions from the computer-readable media. Some non-limiting examples of the invention can include (or utilize) a device such as an automation device, a special purpose or programmable computer including various computer hardware, software, firmware, and so on, consistent with the discussion below.

The term “article of manufacture” as used herein is intended to encompass a computer program accessible from any computer-readable device, carrier (e.g., non-transitory signals), or media (e.g., non-transitory media). For example, computer-readable media can include but are not limited to magnetic storage devices (e.g., hard disk, floppy disk, magnetic strips, and so on), optical disks (e.g., compact disk (CD), digital versatile disk (DVD), and so on), smart cards, and flash memory devices (e.g., card, stick, and so on). Additionally, it should be appreciated that a carrier wave can be employed to carry computer-readable electronic data such as those used in transmitting and receiving electronic mail or in accessing a network such as the Internet or a local area network (LAN). Those skilled in the art will recognize many modifications may be made to these configurations without departing from the scope or spirit of the claimed subject matter.

Certain operations of disclosed methods, or of systems executing those methods, may be represented schematically in the figures or otherwise discussed herein. Unless otherwise specified or limited, representation in the figures of particular operations in particular spatial order may not necessarily require those operations to be executed in a particular sequence corresponding to the particular spatial order. Correspondingly, certain operations represented in the figures, or otherwise disclosed herein, can be executed in different orders than are expressly illustrated or described, as appropriate for particular non-limiting examples of the invention. Further, in some non-limiting examples, certain operations can be executed in parallel, including by dedicated parallel processing devices, or separate computing devices configured to interoperate as part of a large system.

As used herein in the context of computer implementation, unless otherwise specified or limited, the terms “component,” “system,” “module,” etc. are intended to encompass part or all of computer-related systems that include hardware, software, a combination of hardware and software, or software in execution. For example, a component may be, but is not limited to being, a processor device, a process being executed (or executable) by a processor device, an object, an executable, a thread of execution, a computer program, or a computer. By way of illustration, both an application running on a computer and the computer can be a component. One or more components (or system, module, and so on) may reside within a process or thread of execution, may be localized on one computer, may be distributed between two or more computers or other processor devices, or may be included within another component (or system, module, and so on).

As used herein, the term, “controller” and “processor” and “computer” include any device capable of executing a computer program, or any device that includes logic gates configured to execute the described functionality. For example, this may include a processor, a microcontroller, a field-programmable gate array, a programmable logic controller, etc. As another example, these terms may include one or more processors and memories and/or one or more programmable hardware elements, such as any of types of processors, CPUs, microcontrollers, digital signal processors, or other devices capable of executing software instructions.

The invention claimed is:

1. An integrated microcrystal electron diffraction system comprising:
- an electron source;
- a sample assembly configured to retain a sample;
- a camera assembly; and
- a control system including an electronic processor, the control system configured to:
  - pre-screen the sample on the sample assembly, where pre-screening the sample includes:
    - capturing, by the camera assembly, at least one pre-screen diffraction image of the sample,
    - determining, by the control system, a position for the sample for imaging based on the at least one pre-screen diffraction image, wherein determining the position for the sample includes:
      - identifying m target crystals of the sample on the sample assembly,
      - generating a respective diffraction score for at least one of the m target crystals based on respective diffraction images of the m target crystals, and
      - selecting one of the m target crystals for imaging based on the respective diffraction scores, the selected one of the target crystals corresponding to the position for the sample for imaging, and
    - controlling, by the control system, the sample assembly to position the sample at the position;
  - collect image data of the sample via the camera assembly, wherein collecting the image data includes:
    - generating, by the electron source, an electron beam towards the sample at the position,
    - rotating the sample assembly, and capturing, by the camera assembly, scatterings of the electron beam by the sample as diffraction images while the sample assembly is rotated; and output microcrystal electron diffraction data based on the image data.

2. The system of claim 1, further comprising:

a condenser lens assembly positioned between the electron source and the sample assembly, the condenser lens assembly configured to condense the electron beam from the electron source and to provide the electron beam as a condensed electron beam to the sample to provide the scatterings of the electron beam that are captured as the diffraction images.

3. The system of claim 2, further comprising:

a post-sample lens assembly positioned between the sample assembly and the camera assembly, the post-sample lens assembly configured to focus the scatterings of the electron beam for the camera assembly.

4. The system of claim 3, further comprising:

a preset selector, wherein the control system is further configured to:

receive, from the preset selector, a selection of a preset magnification configuration selected from a plurality of preset magnification configurations, and configure the condenser lens assembly and the post-sample lens assembly into the preset magnification configuration.

5. The system of claim 3, wherein the condenser lens assembly includes a first aperture and a first aperture actuator configured to control the first aperture to selectively permit the electron beam to pass through the first aperture, and wherein the post-sample lens assembly includes a second aperture and a second aperture actuator configured to control the second aperture to selectively permit the scatterings of the electron beam to pass through the second aperture.

6. The system of claim 1, further comprising:

a housing including a base and a tower supported by the base, the base housing:

the control system, a vacuum system configured to produce a vacuum within the tower, power circuitry configured to provide power to the electron source, the camera assembly, and the vacuum system, and the tower housing:

the electron source, the sample assembly, the camera assembly, a condenser lens assembly, and a post-sample lens assembly.

7. The system of claim 1, wherein the control system is further configured to:

process the image data to identify and index diffraction points in the diffraction images of the image data;

determine insufficient diffraction data has been captured in the image data; and collect additional image data in response to determining that insufficient diffraction data has been captured in the image data.

8. The system of claim 1, wherein the control system is further configured to:

process the image data to identify and index diffraction points in the diffraction images of the image data, wherein the output microcrystal electron diffraction data is further based on the processing of the image data and includes one or more of the following:

an atomic structure of the sample, an identity of the sample, an identification of components of the sample, an amount of contamination of the sample, an identification of contaminants of the sample, and a three-dimensional graph of diffraction data generated from a combination of the diffraction images.

9. The system of claim 1, wherein the control system is further configured to:

tag each of the diffraction images with characteristic data, wherein the characteristic data includes one or more of the following: current time, time of exposure start, time of exposure end, preset magnification setting, wavelength of the electron beam, diffraction length, rotation axis of the sample assembly, rotation speed of the sample assembly, rotation angle of the sample assembly, flux measurement, or ratio of incident beam and diffracted beam.

10. The system of claim 1, wherein the diffraction score for each respective diffraction image is an intensity value, a signal-to-noise ratio, a spread value, or a combination thereof.

11. A method for integrated microcrystal electron diffraction comprising:

pre-screening a sample on a sample assembly, where pre-screening the sample includes:

capturing, by a camera assembly, at least one pre-screen diffraction image of the sample, determining, by a control system including an electronic processor, a position for the sample for imaging based on the at least one pre-screen diffraction image, wherein determining the position for the sample includes:

identifying m target crystals of the sample on the sample assembly, generating a respective diffraction score for at least one of the m target crystals based on respective diffraction images of the m target crystals, and selecting one of the m target crystals for imaging based on the respective diffraction scores, the selected one of the target crystals corresponding to the position for the sample for imaging, and controlling, by the control system, the sample assembly to position the sample at the position;

collecting image data of the sample, wherein collecting the image data includes:

generating, by an electron source, an electron beam towards the sample at the position, rotating the sample assembly, and capturing, by the camera assembly, scatterings of the electron beam by the sample as diffraction images while the sample assembly is rotated; and outputting, by the control system, microcrystal electron diffraction data based on the image data.

12. The method of claim 11, further comprising:

condensing, by a condenser lens assembly positioned between the electron source and the sample assembly, the electron beam from the electron source to provide the electron beam as a condensed electron beam to the sample to provide the scatterings of the electron beam that are captured as the diffraction images.

13. The method of claim 12, further comprising:
focusing, by a post-sample lens assembly positioned between the sample assembly and the camera assembly, the scatterings of the electron beam for the camera assembly.

14. The method of claim 13, further comprising:
receiving, from a preset selector, a selection of a preset magnification configuration selected from a plurality of preset magnification configurations, and
configuring, by the control system, the condenser lens assembly and the post-sample lens assembly into the preset magnification configuration.

15. The method of claim 13, further comprising:
controlling, by a first aperture actuator, a first aperture of the condenser lens assembly to selectively permit the electron beam to pass through the first aperture; and
controlling, by a second aperture actuator, a second aperture of the post-sample lens assembly to selectively permit the scatterings of the electron beam to pass through the second aperture.

16. The method of claim 11, further comprising:
housing, by a base of a housing,
the control system,
a vacuum system configured to produce a vacuum within a tower of the housing,
power circuitry configured to provide power to the electron source, the camera assembly, and the vacuum system; and
housing, by the tower supported by the base,
the electron source,
the sample assembly,
the camera assembly,
a condenser lens assembly, and
a post-sample lens assembly.

17. The method of claim 11, further comprising:
processing the image data to identify and index diffraction points in the diffraction images of the image data;
determining insufficient diffraction data has been captured in the image data; and
collecting additional image data in response to determining that insufficient diffraction data has been captured in the image data.

18. The method of claim 11, further comprising:
processing the image data to identify and index diffraction points in the diffraction images of the image data,
wherein the output microcrystal electron diffraction data is further based on the processing of the image data and includes one or more of the following:
an atomic structure of the sample,
an identity of the sample,
an identification of components of the sample,
an amount of contamination of the sample,
an identification of contaminants of the sample, and
a three-dimensional graph of diffraction data generated from a combination of the diffraction images.

19. The method of claim 11, further comprising:
tagging each of the diffraction images with characteristic data, wherein the characteristic data includes one or more of the following: current time, time of exposure start, time of exposure end, preset magnification setting, wavelength of the electron beam, diffraction length, rotation axis of the sample assembly, rotation speed of the sample assembly, rotation angle of the sample assembly, flux measurement, or ratio of incident beam and diffracted beam.

20. The method of claim 11, wherein the diffraction score for each respective diffraction image is an intensity value, a signal-to-noise ratio, a spread value, or a combination thereof.

* * * * *